(12) United States Patent
Ivonin et al.

(10) Patent No.: US 7,934,172 B2
(45) Date of Patent: Apr. 26, 2011

(54) SLM LITHOGRAPHY: PRINTING TO BELOW K1=.30 WITHOUT PREVIOUS OPC PROCESSING

(75) Inventors: Igor Ivonin, Gothenburg (SE); Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 921 days.

(21) Appl. No.: 11/710,710

(22) Filed: Feb. 26, 2007

(65) Prior Publication Data

US 2007/0209029 A1    Sep. 6, 2007

Related U.S. Application Data

(60) Provisional application No. 60/776,275, filed on Feb. 24, 2006.

(51) Int. Cl.
*G06F 17/50* (2006.01)
(52) U.S. Cl. .............................. 716/19; 716/1
(58) Field of Classification Search ............... 716/1, 20, 716/19
See application file for complete search history.

(56) References Cited

U.S. PATENT DOCUMENTS

| | | | |
|---|---|---|---|
| 5,383,000 A | 1/1995 | Michaloski et al. | |
| 5,595,857 A | 1/1997 | Fukuda et al. | |
| 5,621,498 A | 4/1997 | Inoue et al. | |
| 5,715,039 A | 2/1998 | Fukuda et al. | |
| 2003/0128347 A1 | 7/2003 | Case et al. | |
| 2004/0184030 A1 | 9/2004 | Liebchen | |
| 2005/0185159 A1* | 8/2005 | Rosenbluth et al. | 355/53 |
| 2005/0243397 A1 | 11/2005 | Latypov | |
| 2006/0068334 A1* | 3/2006 | Sandstrom et al. | 430/322 |
| 2006/0245636 A1* | 11/2006 | Kitamura et al. | 382/149 |
| 2007/0242246 A1* | 10/2007 | Gui et al. | 355/53 |

FOREIGN PATENT DOCUMENTS

| | | |
|---|---|---|
| EP | 0744641 | 11/1996 |
| EP | 0744664 | 11/1996 |
| EP | 1168083 | 1/2002 |
| EP | 1239331 | 9/2002 |
| EP | 1357430 | 10/2003 |
| EP | 1357431 | 10/2003 |
| EP | 1439420 | 7/2004 |
| EP | 1544680 | 6/2005 |

OTHER PUBLICATIONS

International Search Report of International Application No. PCT/SE2006/000932 mailed on Feb. 1, 2007.

(Continued)

*Primary Examiner* — Jack Chiang
*Assistant Examiner* — Suchin Parihar
(74) *Attorney, Agent, or Firm* — Haynes Beffel & Wolfeld LLP; Ernest J. Beffel, Jr.

(57) ABSTRACT

Previously disclosed methods and devices are extended in this application by two-dimensional analysis of optical proximity interactions and by fashioning a computationally efficient kernel for rapid calculation of adjustments to be made. The computations can be made in realtime, whereby the use of OPC assist features can be reduced, with substantial savings in file size and computational requirements. Further aspects of the invention are disclosed in the descriptions, figures, claims and documents incorporated by reference.

12 Claims, 25 Drawing Sheets
(15 of 25 Drawing Sheet(s) Filed in Color)

OTHER PUBLICATIONS

Written Opinion of the International Searching Authority for International Application No. PCT/SE2006/000932 mailed on Feb. 22, 2007.
Written Opinion of the International Searching Authority for International Application No. PCT/EP2007/001638 Jun. 15, 2007.
International Search Report for International Application No. PCT/EP2007/001638 mailed on Jun. 15, 2007.
Sandstrom et al. "SLM Lithography—Printing down to k1=0.30 without previous OPC processing", Proceedings of SPIE—The International Society for Optical Engineering; Optical Microlithography XIX 2006, vol. 6154 II, 2006, XP002435748.
Douglas S. Goodman, "Graphical methods to help understandpartially coherent imaging", Proceedings Of The Spie—The International Society For Optical Engineering SPIE-Int. Soc. Opt. ENG USA, vol. 5377, No. 1,2004, pp. 629-645, XP002435747 ISSN: 0277-786X.
Li Jianliang et al: "Improvement of model kernel representation in process simulation by taking pattern correlation into account" Microelectron Eng; Microelectronic Engineering; Proceedings Of The 32nd International Conference On Micro-And Nano-Engineering May/Aug. 2007, vol. 84, No. 5-8, May 2007, pp. 725-728, XP002435749 the whole document.

\* cited by examiner

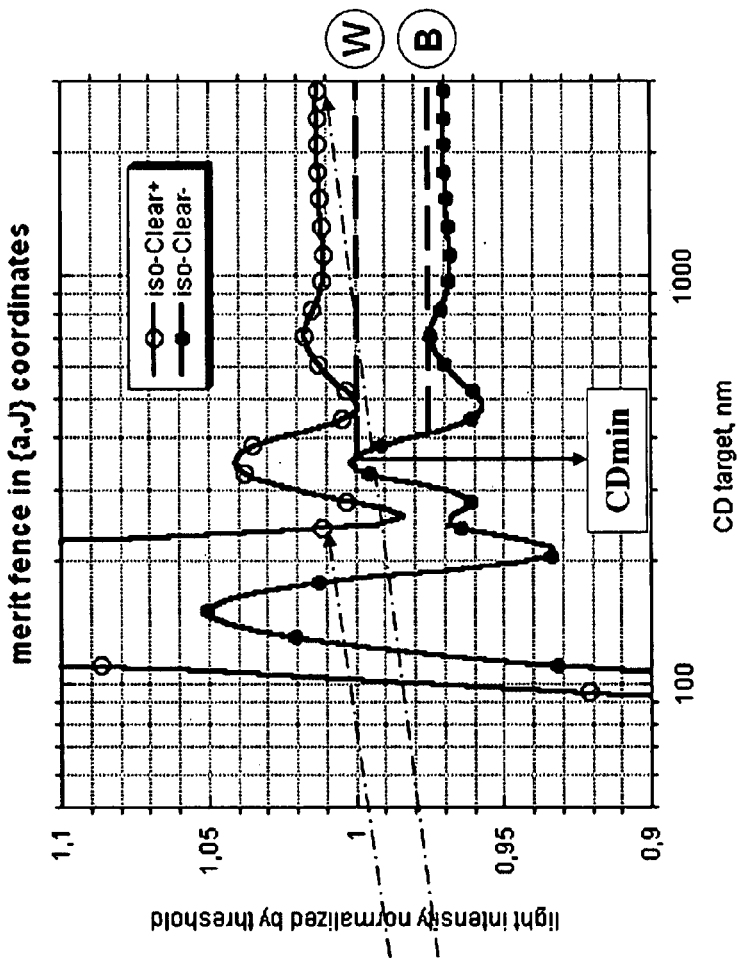
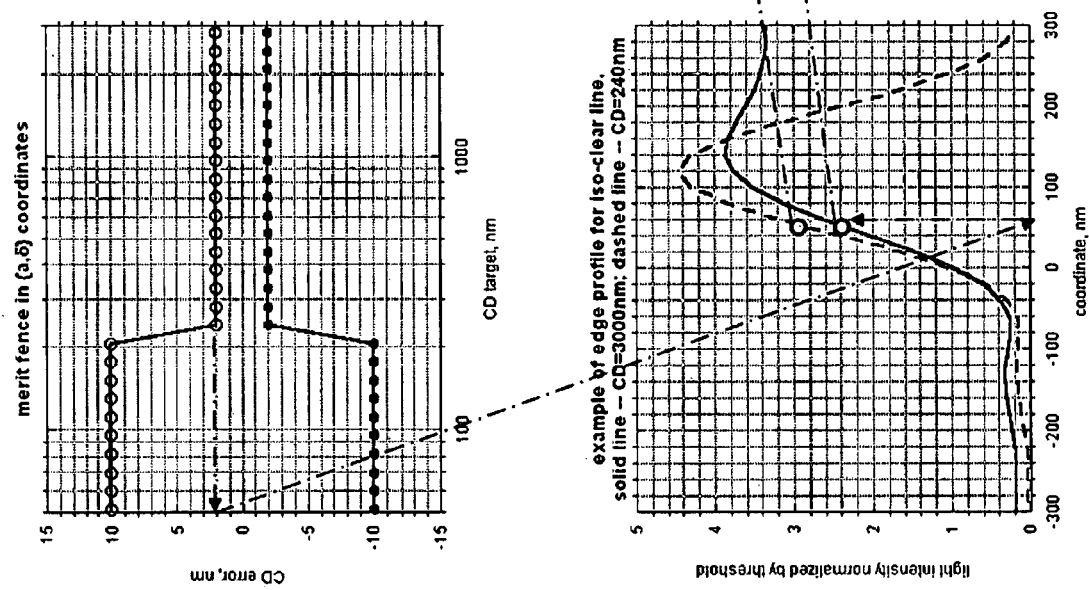
Figure 5 Conversion of merit fences: creates the distributions of "white" and "black" points. Resolution CDmin is determined by the condition W>B of positive intensity gap

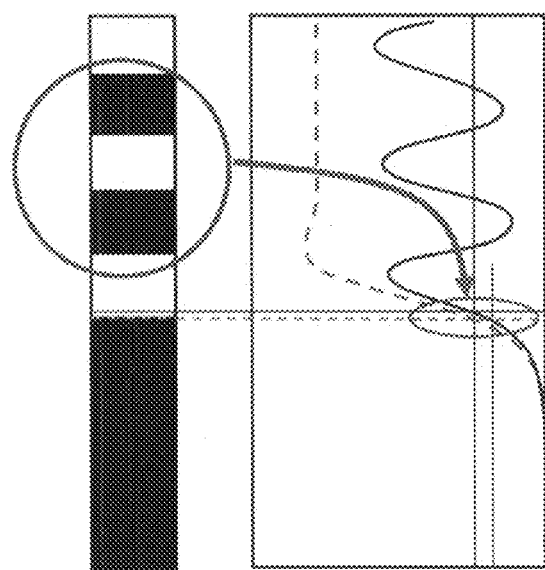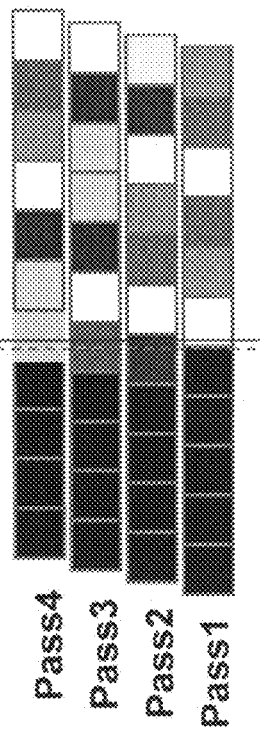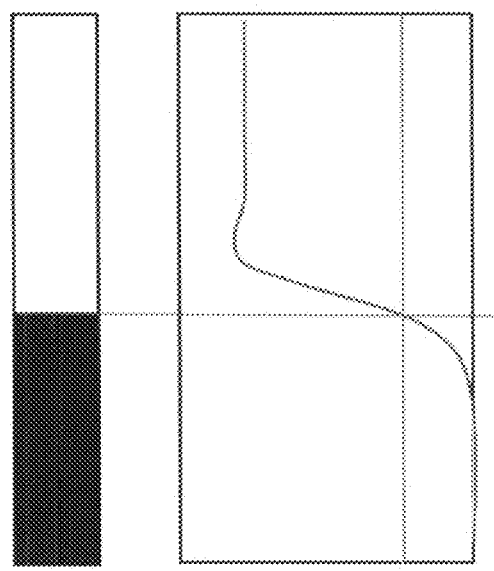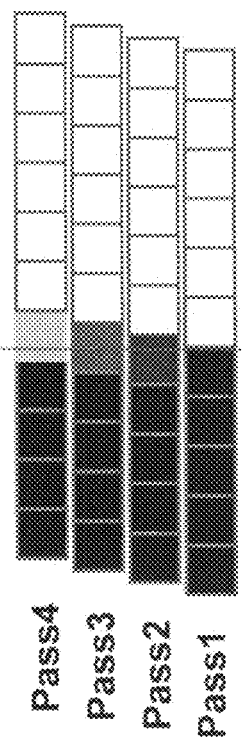
FIG. 22
FIG. 22a
FIG. 22b
FIG. 22c
FIG. 22d
FIG. 22e
FIG. 22f

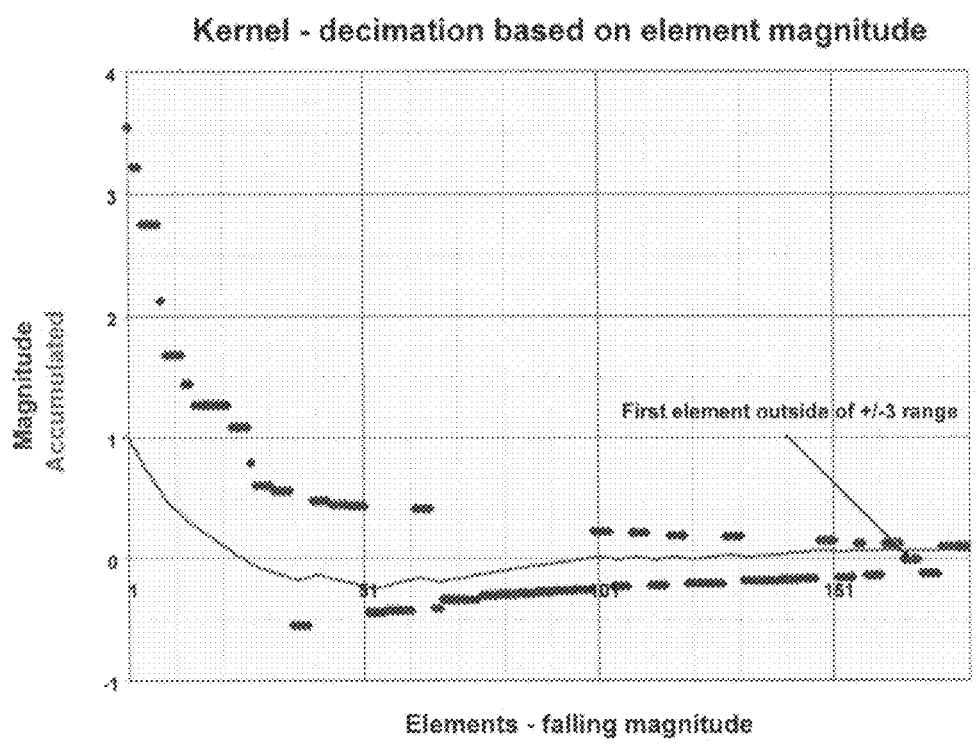
FIG. 29
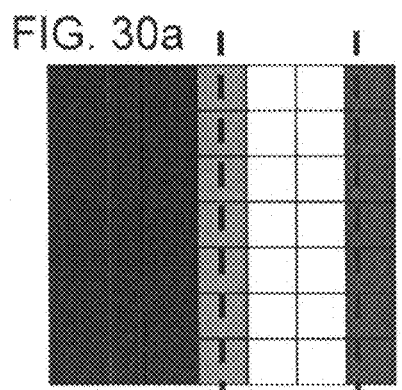
FIG. 30a
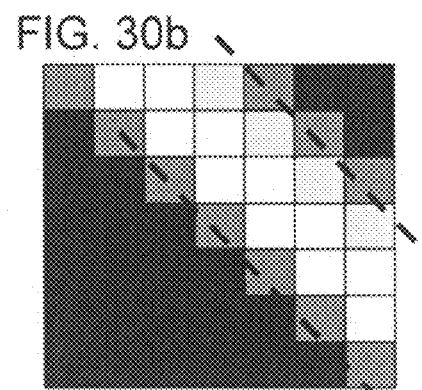
FIG. 30b
FIG. 30
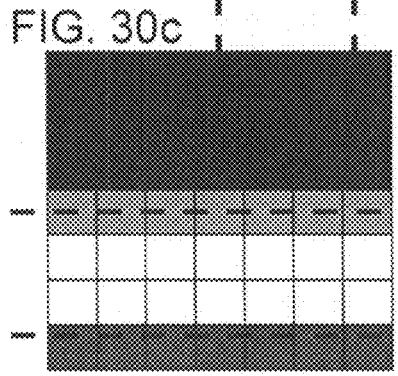
FIG. 30c
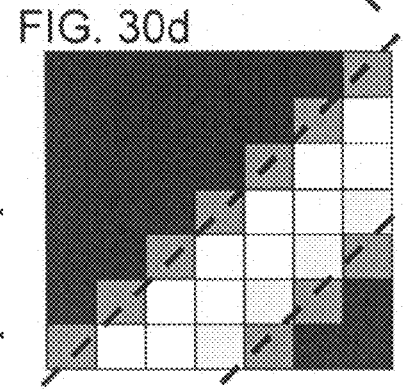
FIG. 30d FIG. 31
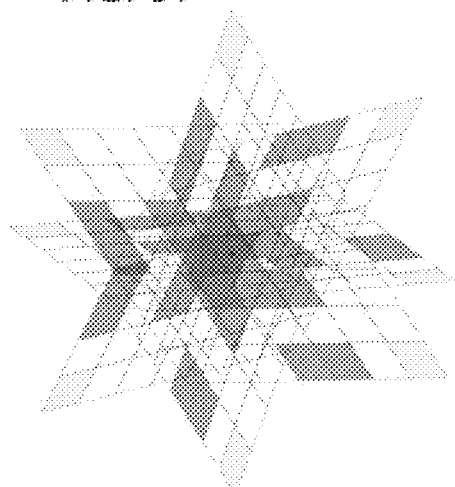
FIG. 32a
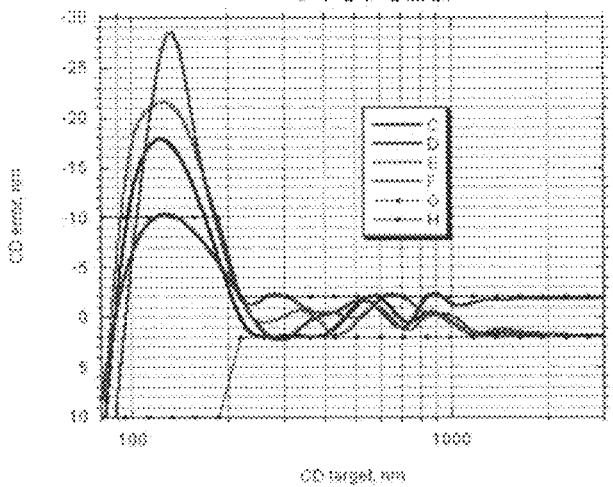
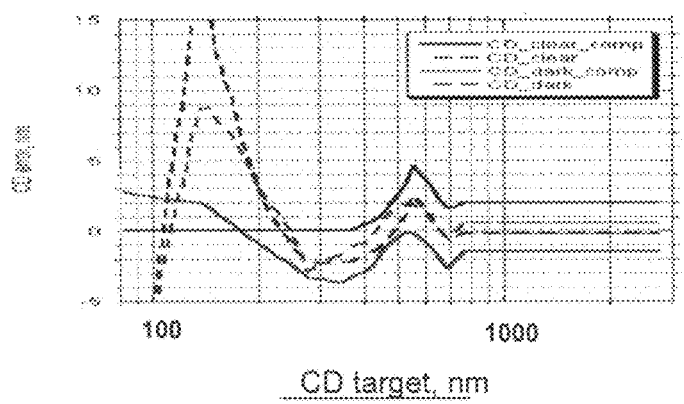
FIG. 32b
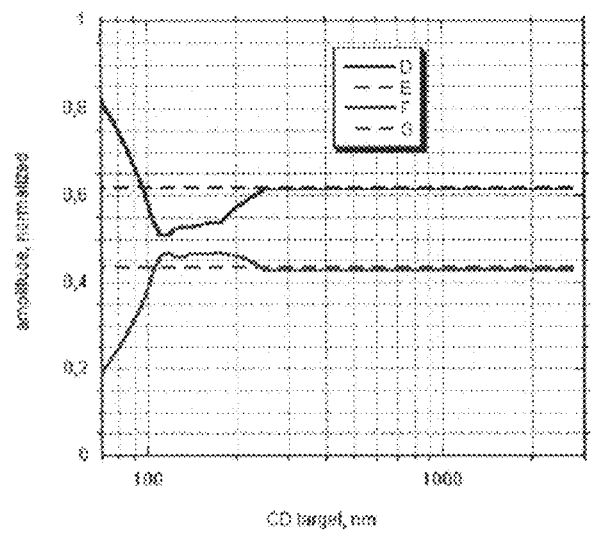
FIG. 32c

SLM LITHOGRAPHY: PRINTING TO BELOW K1=.30 WITHOUT PREVIOUS OPC PROCESSING

PRIORITY INFORMATION

This application claims the benefit of U.S. Provisional Application No. 60/776,275, entitled "SLM Lithography: Printing to Below k1=0.30 Without Previous OPC Processing" filed on 24 Feb. 2006 naming inventors Torbjorn Sandstrom and Igor Ivonin. This application continues in part International Application No. PCT/SE2006/000932, entitled "Method and Apparatus for Projection Printing," filed on 8 Aug. 2006, published in English as WO/2007/018464 and designating the U.S., which International Application claims the benefit of U.S. Provisional Application No. 60/706,550, entitled "Method and Apparatus for Projection Printing," filed on 8 Aug. 2005 naming inventors Igor Ivonin and Torbjorn Sandstrom. The priority documents are hereby incorporated by reference as if set forth in full.

FIELD OF THE INVENTION

There are two aspects to the technology disclosed: First, a method and device with a reduced field of interaction, which simplifies and reduces the need for optical proximity correction (OPC). We disclose filter designs and design methods for illuminator and/or pupil filters that reduce the distance at which one projected feature optically interacts with another at an image plane. Second, a method and device that perform OPC in a device that uses an SLM. This OPC may be calculated as an image is rasterized and loaded into an SLM, by adjusting adjacent pixels to more faithfully reproduce a design on a workpiece, with reduced need for serifs, assist lines and other OPC features.

The present disclosure teaches a method to project an optical image of an original (typically a pattern on a photomask or a spatial light modulator (SLM)) onto a workpiece with extremely high resolution and fidelity given the constraints of the optics. Used with masks, it allows the mask to use less so called optical proximity correction (OPC), which pre-distorts or pre-adjusts a pattern to correct for optical deterioration that is normally found near the resolution limit. Therefore, patterns can be printed with the disclosed technology down to the resolution limit with high fidelity and only simple OPC processing or no OPC processing at all. With spatial light modulators (SLMs) as the image source, e.g., in mask pattern generators and direct-writing lithographic printers, the disclosed technology allows the same simplification. The SLM is driven by data from a data path and with the disclosed technology the data path need not apply OPC-like adjustments to the pattern data, or to apply less OPC adjustments, thereby simplifying the data channel. The disclosed technology is a modification of a partially coherent imaging system, and many partially coherent systems could use and benefit from the disclosed technology: e.g., photosetters, visual projectors, various optical copying machines, etc. The disclosed technology also works for image capture devices that use partially coherent light: optical inspection systems, some cameras, microscopes, etc. A generic partially coherent projection system is shown in FIGS. 1a-b.

BACKGROUND OF THE INVENTION

A projected optical image is always degraded by the projection system due to optical aberrations and to the finite wavelength of light. Aberrations can be reduced by design, but the influence of diffraction of the light due to its finite wavelength puts a limit to the resolution and fidelity that can be achieved. This is well-know and many optical devices operate at the diffraction limit, e.g., microscopes, astronomical telescopes, and various devices used for microlithography. In microlithography, the size of the features printed limit the density of features that can added to the workpiece and therefore the value that can be added to the workpiece at each step. Because of the strong economic forces towards smaller and more numerous features on the workpiece, the optics used in lithographic processes are extremely well designed and limited only be the underlying physics, i.e., diffraction.

Many projection systems are designed as incoherent projectors. Coherence in this application means spatial coherence and is a way of describing the angular subtense of the illumination of the object (the mask, SLM, etc.) in relation to the angular subtense picked up by the projection lens. Incoherent in this sense means that the illumination as seen from the object has a larger angle range than what is transmitted by the projection lens. Tuning of the illumination angles has a profound influence on the image. The incoherent projection gives an image that is pleasing to the eye with a gradual fall-off of the contrast as one gets closer to the resolution limit. But for technical purposes, this fall-off means size errors for everything close to the resolution limit and the smallest features that can be printed with good fidelity are far larger than the resolution limit. In photography, the optical resolution is often determined as the smallest high-contrast object features that appear with any visible contrast in the image. For microlithography, the resolution is pragmatically determined as the smallest features that print with enough quality to be used. Since microlithographic patterns are imaged onto a high-contrast resist and the resist is further raised by the etching process, the quality in the image is almost entirely related to the placement and quality of the feature edges. Resolution is then the smallest size that, given the constraints of the process, gives acceptably small size errors ("critical dimension errors" or "CD") and acceptably large process latitude. Resolution is, therefore, in lithography a stricter definition than in photographic imaging and is more determined by residual CD errors than by the actual limit of the optical system.

With partially coherent illumination, FIGS. 1 a-b, the angular range of the illuminator is limited to smaller than is accepted by the projection lens. This raises the useful resolution by introducing some amount of coherent "ringing" at the edges of the image. These ringing effects also affect neighboring edges and the image shows so called proximity effects: the placement of every edge depends on the features in the proximity to it. The illumination angles, i.e., the distribution of light in the illuminator aperture, can be tuned for higher useful resolution at the expense of more proximity effects and it becomes a trade-off between resolution and image fidelity.

The lithographic industry has raised the resolution by tuning the illumination and correcting residual errors by as much optical proximity processing in the mask data as it takes. As the requirements for both resolution and fidelity have risen, the OPC processing has become very extensive with model-based simulation of essentially whole chips. The OPC processing can be done using specialized software running on computer farms and still take several hours or even days. With OPC adjustments, a more aggressive illuminator can be used. Some historic figures illustrate this.

In the early 1990s, printed linewidths in microlithography were typically 0.70*lambda/NA, where lambda is as normal the wavelength of the light and NA is the sine of the opening half-angle of the projection lens. The factor lambda/NA is a constant for a particular type of equipment. In 2004, industry is printing 0.40*lambda/NA with OPC, sometimes down to about 0.30*lambda/NA, which means that five times more features can be printed using exactly the same optical limitations (lambda and NA). This requires heavy OPC correction in the masks. Correcting for the effects of the printing on the wafer adds cost, overhead and lead time. The extensive OPC corrections currently used in state-of-the-art products have produced an explosion of the data file size. At the 90 and 65 nm design nodes, pattern data files may be 50 Gbyte or more in size and even the transmission and storage of the files becomes a burden to the design houses and mask shops. Adding one more layer of OPC corrections for the printing of the mask in an SLM-based pattern generator would add more cost, overhead and make the lead time even longer.

Therefore, there is a need in the art for an improved method for printing highly accurate patterns. One use of the disclosed technology is to optimize the optics in order to lessen or even remove the need for optical proximity correction. It can be applied in the maskwriter, in a direct-writer or in mask-based lithography.

SUMMARY OF THE INVENTION

Previously disclosed methods and devices are extended in this application by two-dimensional analysis of optical proximity interactions and by fashioning a computationally efficient kernel for rapid calculation of adjustments to be made. The computations can be made concurrently with rasterizing or even in realtime, whereby the use of OPC assist features can be reduced, with substantial savings in file size and computational requirements. Further aspects of the invention are disclosed in the descriptions, figures, claims and documents incorporated by reference.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Reference is now made to the following description taken in conjunction with accompanying drawings, in which:

FIG. 5: Optimization of the aperture functions in a preferred embodiment with NA=0.82, obscuration=16%, and lambda=248 nm, showing the merit fence and the CD linearity and an edge trace.

In FIG. 19a, the pupil filter 191 varies as a function of position in the aperture plane of the projection lens 190.

FIG. 20a shows a beam expander 201, 203 expanding the beam from the laser and shaping it with a transmission filter. FIG. 20b shows the same laser beam dispersed with a diffractive element 205 which directs the beam energy into a spatial distribution equivalent to the one in FIG. 20a.

FIG. 20b: Shows the same laser beam dispersed with a diffractive element 205 which directs the beam energy into a spatial distribution equivalent to the one in FIG. 20a.

FIGS. 22a-f depict a simple reference pattern and one perturbed by adjacent lines.

FIG. 29 depicts selection of kernel elements for an automatically or hand crafted kernel.

FIG. 30a-d illustrate development of a pseudo-2D kernel from variations on a 1D kernel.

FIG. 31 is a visualization of selecting element from four-dimensional space for a 2D kernel.

FIGS. 32a-c illustrate CD linearity with and without the correction.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Generic Projection System/Platform

Figure 1A:
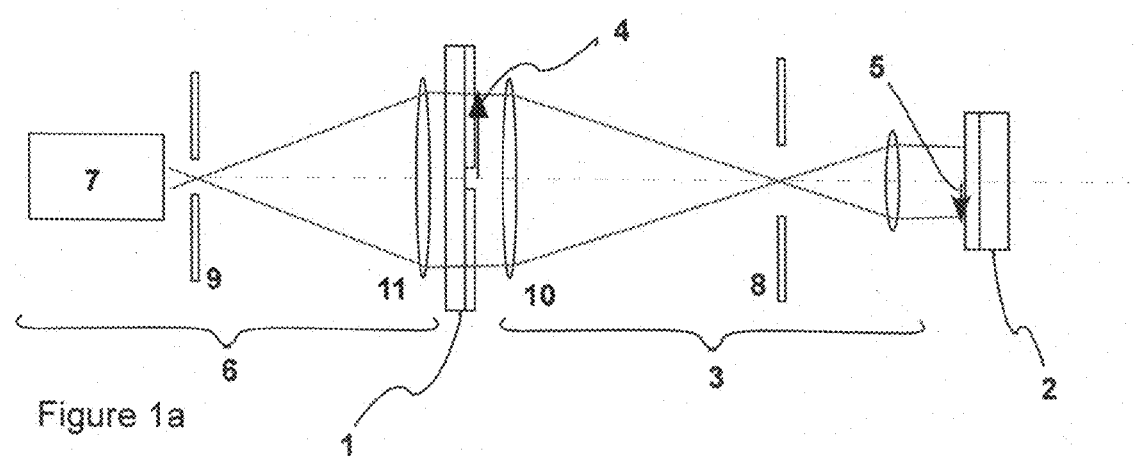
FIG. 1a: Simple partially coherent projection system with illumination and projection stops defined.

A generic projection system has been defined in FIG. 1a. It has an object 1, which can be a mask or one or several SLMs, and a workpiece 2, e.g., a mask blank, a wafer or a display device. Between them is a projection system 3 creating an image 5 of the image 4 on the object. The object is illuminated by an illuminator 6. The projection system consists of one or several lenses (shown) or curved mirrors. The NA of the projection system is determined by the size of the pupil 8. The illuminator 6 consists of an essentially non-coherent light source 7 illuminating the illumination aperture 9. Field lenses 10 and 11 are shown but the presence of field lenses is not essential for the function. The imaging properties are determined by the size and intensity variation inside the illuminator aperture 9 in relation to the size of the pupil 8. The term partially coherent beam indicates that the illuminator aperture is smaller than the pupil, but not infinitely small.

Figure 1B:
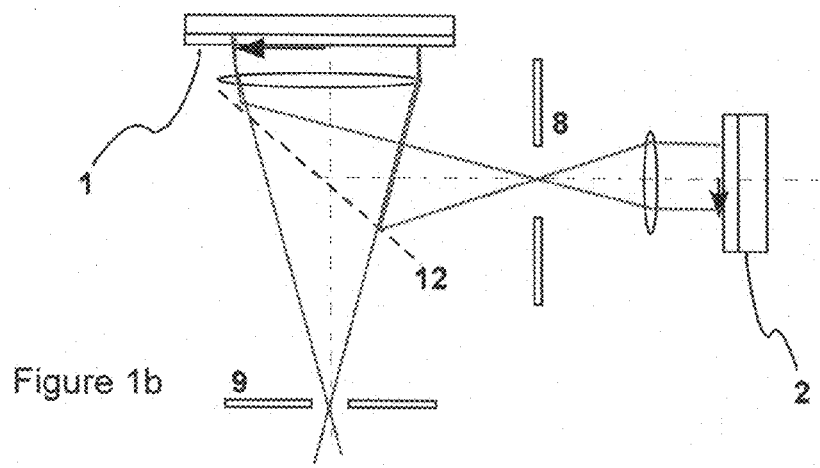
FIG. 1b: Partially coherent projection system using reflecting objects, such as an SLM or a EUV mask.

The basic projection system in FIG. 1a can be realized in many equivalent forms, e.g., with a reflecting object as shown in FIG. 1b. The imaging power of the optical system can be refractive, diffractive or residing in curved mirrors. The reflected image can be illuminated through a beam splitter 12 or at an off-axis angle. The wavelength can be ultraviolet or extending into the soft x-ray (EUV) range. The light source can be continuous or pulsed: visible, a discharge lamp, one or several laser sources or a plasma source. The object can be a mask in transmission or reflection or an SLM. The SLM can be binary or analog; for example micromechanical, using LCD modulators, or using olectrooptical, magnetooptical, electroabsorbtive, electrowetting, acoustooptic, photoplastic or other physical effects to modulate the beam.

Figure 1C:
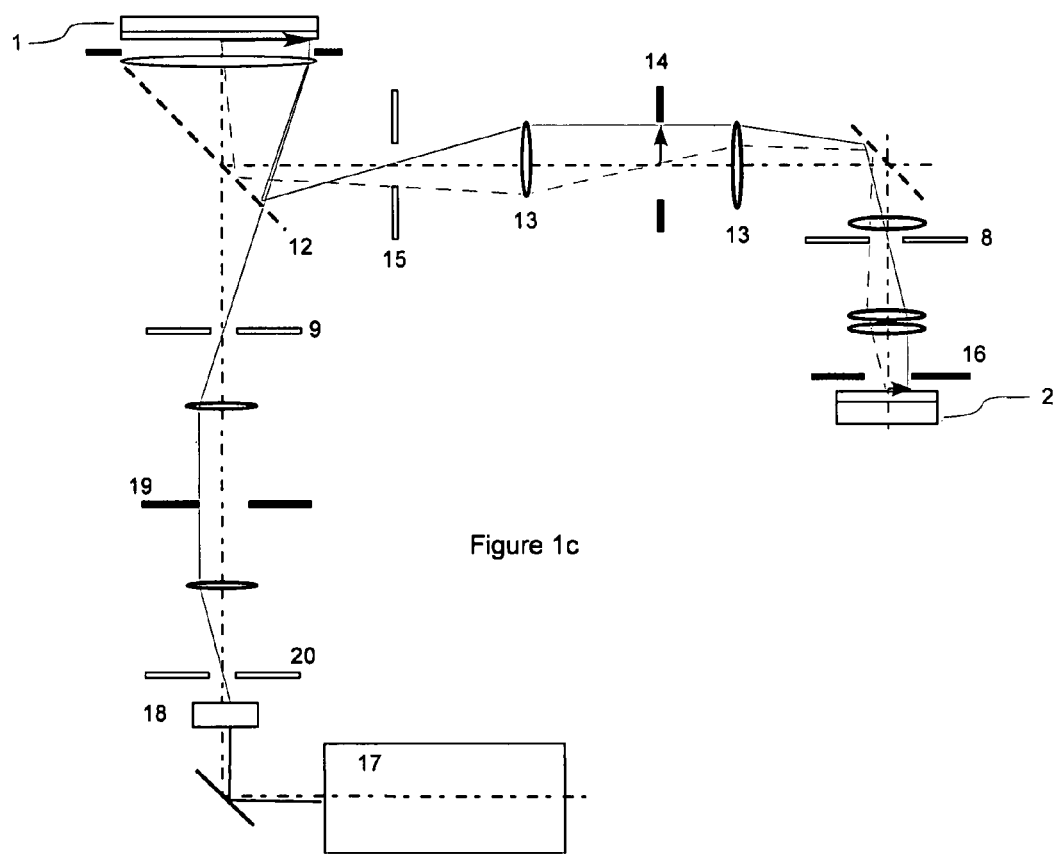
FIG. 1c: Partially coherent projection system using an SLM and relays in the illuminator and projection paths.

FIG. 1c shows a more complex implementation of the basic structure of FIG. 1b: the principal layout of the optics for the Sigma7300 mask writer made by Micronic Laser Systems AB. It has an excimer laser 17, a homogenizer 18, and relay lenses 13 forming an intermediate image 14 between the SLM and the final lens. The pupil of the final lens is normally located inside the enclosure of the final lens and difficult to access, but in FIG. 1c there is an equivalent location 15 in the relay. The smallest of the relay and lens pupils will act as the system stop. There is also a relay in the illuminator providing multiple equivalent planes for insertion of stops and baffles. The Sigma7300 has a catadioptric lens with a central obscuration of approximately 16% of the open radius in the projection pupil.

Some of the examples below are based on a dry 248 nm mask writer. The lens is catadioptric with NA=0.90 and a central obscuration. $\lambda/NA$ is 275 nm. The SLM mirror size is set by manufacturing constraints and is not important for this treatment. For mirrors above 2 micron size the 3D topography of the mirrors has no importance [3]. The SLM can be treated as a thin (Kirchoff) mask. The pixel size in the image plane is important, as we will see, and will be determined below. The demagnification is then chosen to give the wanted pixel size for any given SLM mirror size.

The size of the illumination aperture and the intensity distribution inside it have a profound effect on resolution and image fidelity. A ring with inner/outer diameters of 0.2/0.6 of the system pupil gives neutral imaging with a good trade-off between resolution and fidelity. Other intensity distributions like a four-pole or a two-pole enhance certain features at the expense of others. In a pattern with varying line widths or varying pitch, it is nearly always necessary to do an optical proximity correction of the printed features are below 0.5 NA/lambda.

One may modify the resolution and fidelity of fully coherent systems by so called apodization, i.e., a modification of the light distribution in the pupil. Normally this is done in order to increase or decrease the depth of focus or to decrease the size of the central diffraction lobe.

Illuminator and Pupil Fitters—Introduction

We disclose methods to modify a partially coherent projection system for higher resolution and image fidelity. The pupil transmission is modified and optimized for improved image fidelity and reduced need for OPC correction of the pattern. Simultaneously, the intensity distribution in the illumination aperture is optimized to support the pupil function and interact with it so as to produce good image fidelity.

Figure 2A:
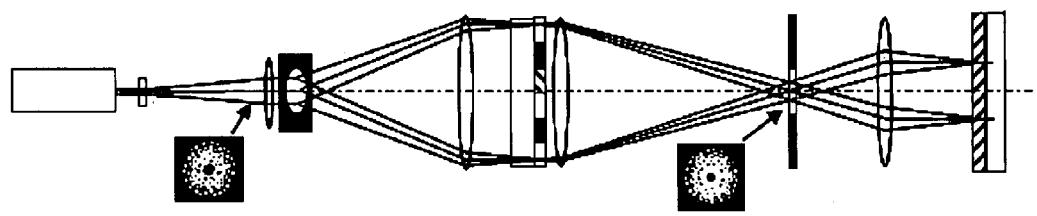
FIG. 2a: Projection system with a pupil filter and a varying illumination function, either from a filter or from a diffractive optical element (DOE).
Figure 2B:
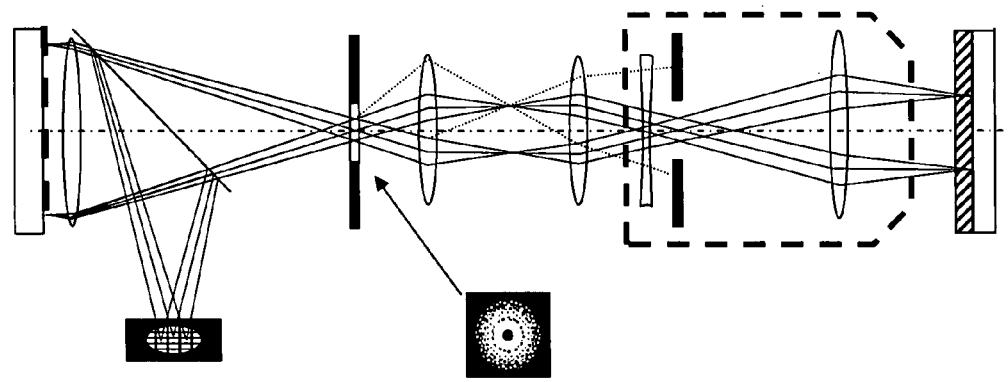
FIG. 2b: Projection system with an accessible pupil plane, and a pupil filter implemented by an absorbing, reflecting or phase-shifting binary pattern with features small enough to reflect or diffract light outside of the pupil stop.
Figure 2C:
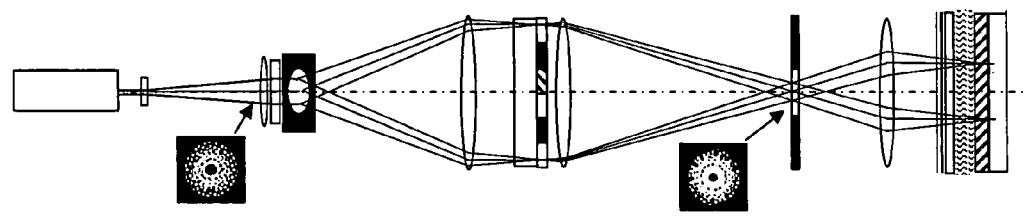
FIG. 2c: Projection system with immersion, an angle-dependent thin-film reflector as a polarization-selective pupil filter and a polarization filter in the illuminator.

Optimized CD linearity for 65 nm node: resolution is 81 nm when keeping ±2 nm CD error restriction above CD=240 nm. FIG. 2 shows the same generic system as in FIG. 1a, with the addition of a pupil filter 21 and an illumination aperture filter 22. Using two transmission filters is the simplest embodiment disclosed. The two filters can be described by a pupil function and an illuminator aperture function describing the transmission through the filters. The pupil filter is complex, i.e., both phase and magnitude of the transmission are specified. The illuminator aperture filter is an intensity filter, i.e., the phase is arbitrary. The functions have a continuous or semi-continuous variation with the pupil and aperture coordinate coordinates. Continuous means the same as a continuous function, it does not have steps. However, due to manufacturing and design restrictions, the functions need to have discontinuities. A continuously varying phase filter may be manufactured as a stepwise varying function. Likewise, truncation of the function at the edges of the aperture can be discontinuous. We will call such functions that approximate continuously varying functions over at least part of the area of the filter semi-continuous.

Functions for Filter Design

Figure 3A:
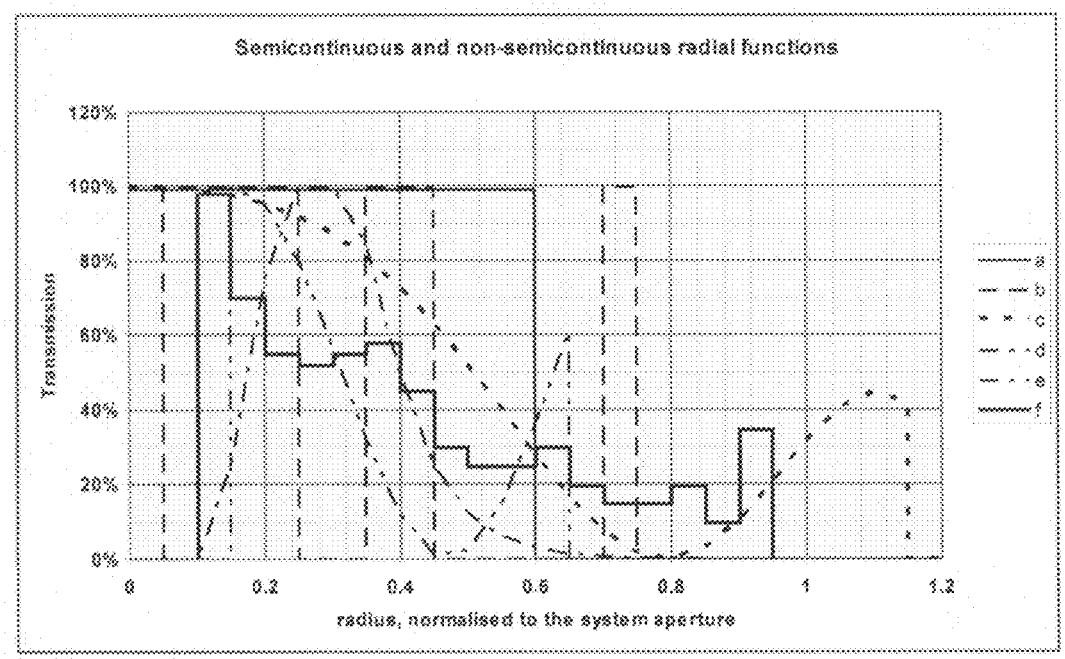
FIG. 3a: Showing semi-continuous functions.
Figure 3B:
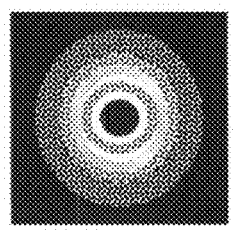
FIG. 3b: Rotationally symmetrical functions.
Figure 3C:
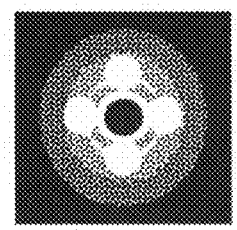
FIG. 3c: Non-rotationally symmetrical function with symmetry for 0, 90, 180 and 270 degree features.
Figure 4:
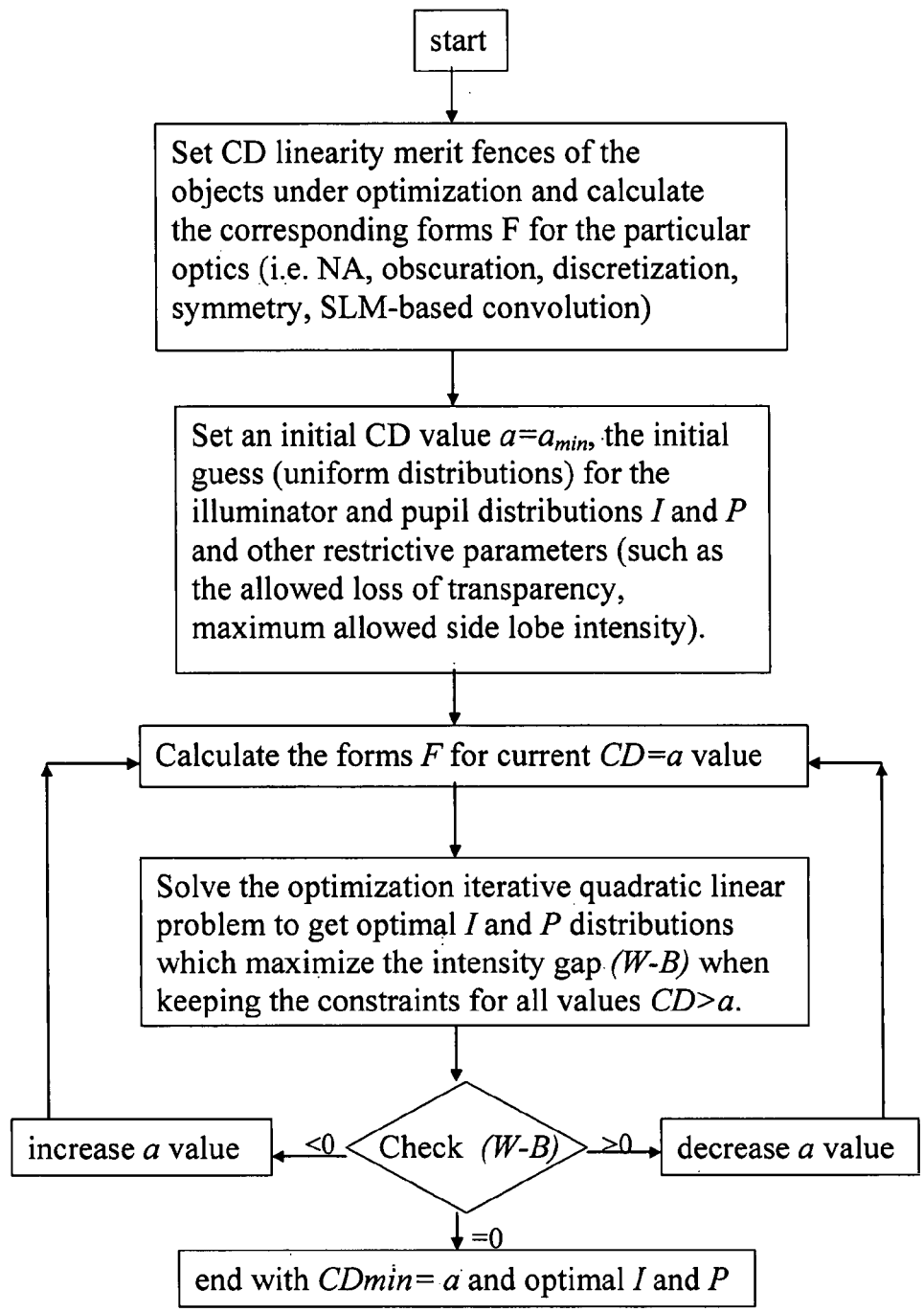
FIG. 4: Flow-chart of a method of optimization of the aperture functions.

FIG. 3a shows the results of applying hypothetical examples of pupil and/or illuminator functions. Line a is a top-hat disk function. Line b a more complex function with varying transmitting and non-transmitting rings. Lines c-f show a variety of semi-continuous functions. Line e is a fully continuous function, while lines c and d show functions that are continuous but truncated. Finally, line f shows a piecewise flat approximation of a continuous but truncated function. Line f displays several interesting features: First it shows a "pile-up" close to the truncation edges at 0.10 and 0.90. Second, it is a basic smooth function with a superposed ring pattern with maxima at 0.47, 0.62, and 0.82. Both these features are useful in the optimization functions. FIGS. 3b-c are examples of illuminator and pupil filters for 65 nm node.

Restriction for maximum allowed 90% side lobe intensity level (from the nominal intensity) is applied. Ten radial harmonics were used both for pupils and for the illuminator. The illuminator is represented by 60×60 grid pixels.

Figure 9:
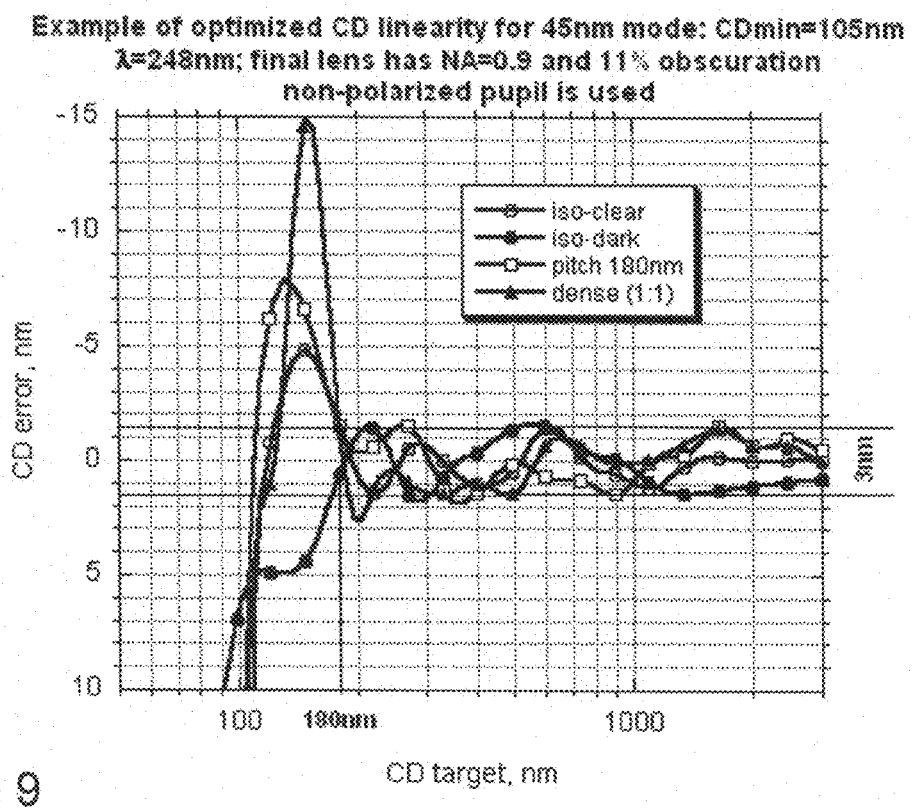
FIG. 9: CD linearity curves using the apertures in FIG. 8.

FIG. 9 is an example of optimized CD linearity for 45 nm node. CD linearity profiles are within 3 nm CD error range above CD=180 nm. Final lens with 11% obscuration is used.

Figure 8:
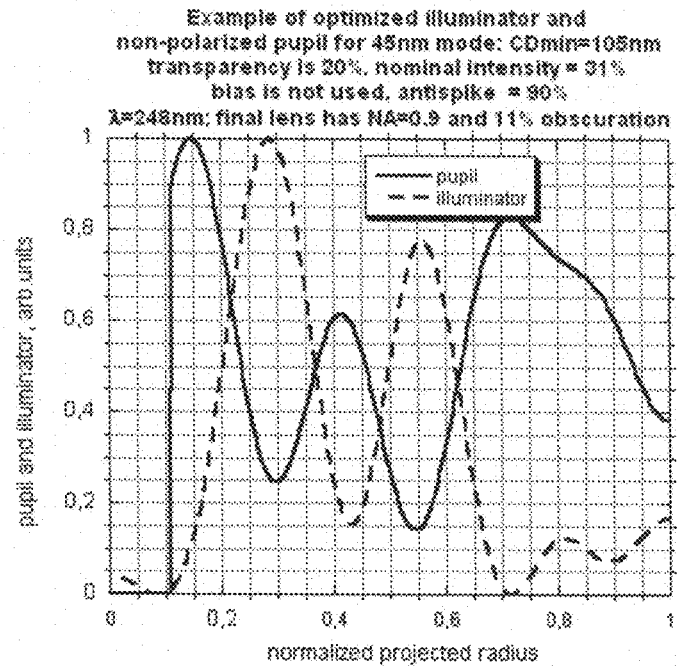
FIG. 8: Aperture functions in a preferred embodiment with NA=0.90, 11% obscuration, lambda=248 nm and no polarization.

FIG. 8 is an example of optimized illuminator and non-polarized pupil for 45 nm node. 20% restriction for minimum allowed transparency is applied. Self-consistency in the pupil and illuminator distributions is clearly seen.

Figure 11:
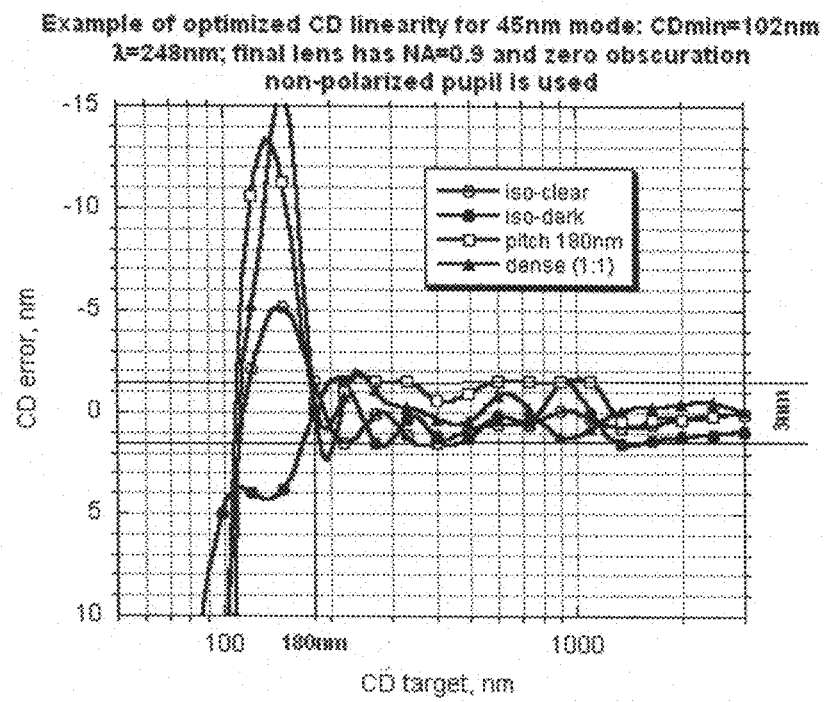
FIG. 11: CD linearity curves using the apertures in FIG. 10.

FIG. 11 is an example of optimized CD linearity for 45 nm node for the lens without obscuration. CDmin value is similar to that in FIG. 9. FIG. 3c is an illuminator function that extends outside of the radius of the system aperture. This is like adding a small amount of dark-field imaging in a microscope and aids in optimizing the coherency function of the mask or SLM plane.

Figure 10:
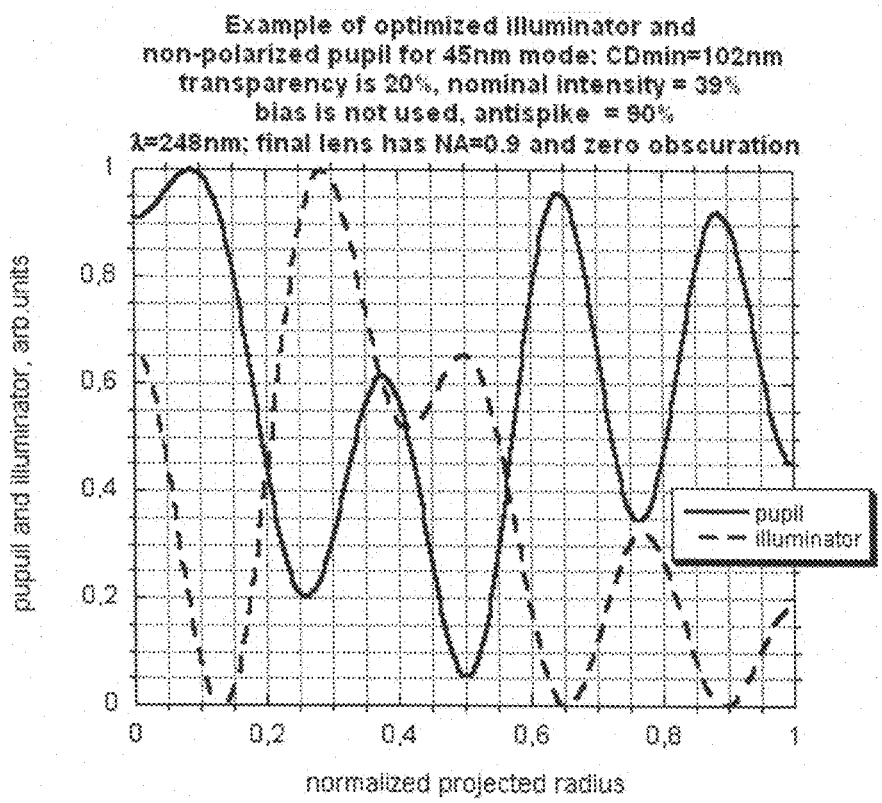
FIG. 10: Aperture functions in a preferred embodiment with NA=0.90, no obscuration, lambda=248 nm and no polarization.

FIG. 10 is an example of optimized illuminator and non-polarized pupil for 45 nm node. A final lens without obscuration is used. Compare with FIG. 8.

FIG. 11 is the CD uniformity in focal region. The CD curves in focal plane (solid curves) are the same as in other designs.

The aperture stop has a transmission that varies in a more complex fashion. In general it can be complex, i.e., it can the phase specified as well as the magnitude and polarization.

Furthermore, the transmission varies in a more complex way than the simple clear ring that is used in Sigma7300. One preferred embodiment has a phase that is everywhere 0 but an intensity transmission that is a continuous function of the radius. Another preferred embodiment has the phase 0 and a stepwise varying transmission. A third embodiment has a phase that varies in a continuous fashion, and fifth embodiment has a phase that varies in a stepwise fashion. In a sixth embodiment, both the transmission and the phase vary. In a seventh embodiment, the transmission function is a combination of continuously and stepwise varying parts. An eighth embodiment uses a function that combines continuously and/or stepwise varying transmission with a continuously and/or stepwise varying phase. In a ninth embodiment, the aperture stop is at each point described by a complex number and the complex number varies continuously and/or stepwise over the area of the stop.

Additionally, the illumination can vary over the illumination pupil. This variation can be created in several ways, e.g., by an absorbing filter before the object, preferably near the illumination stop or an optically equivalent plane, or by a diffractive optical element (DOE) before, at, or after the stop. Whatever the method for creating the variation, the illuminating intensity vs. angle function at the object plane has an intended variation more complicated than the simple clear ring with inner and outer sigmas of 0.20 and 0.60 used in the Sigma7300. The quantity sigma, often used in lithography, is the relation of a radius in the illuminator and the outer radius of the projection stop compared when they are projected to the same plane, e.g., in the plane of the projection stop. The variation of the intensity in the illumination stop (or the equivalent variation if it is created after the stop) can be described by a continuous or stepwise function or a function with a combination of continuously and stepwise varying parts.

Furthermore, the illumination light can have a polarization direction (or more generally polarization state) that varies over the stop and optionally between different writing passes and writing modes. The projection stop, or an equivalent plane, can have a polarization-modifying property that varies over the surface and/or between writing passes and writing modes. The description where the stop could at each point be described by a complex number is then generalized to a Mueller matrix. A Mueller matrix can change the state of polarization and the degree of polarization, thereby representing polarizers and depolarizers, as well as wave-plates and polarization rotators, as described in Azzam and Bashara "Ellipsometry and polarized light". Each matrix element is a function over the area and can vary continuously or stepwise. If the projection stop is described by Mueller matrices, it is convenient to describe the illumination by Stokes vectors that represent intensity, polarization state and degree of polarization, as described in the textbook reference.

The variation at both projection and illumination stops can be fully rotationally symmetrical or it can be symmetrical under a rotation of 180, 90 or 45 degrees only. It can also be non-centro-symmetric with no rotation symmetry.

For simplicity, we will call the variations filters. The pupil filter describes the variation in the projection lens aperture plane or an equivalent plane. The illumination filter is the variation of the illumination versus angle as seen from the object, represented by an equivalent filter at the illuminator stop. It is useful to improve the printing resolution and fidelity the filters with a design for the printing case at hand. The connection between the pupil functions and the printing properties is complex and can only be analyzed by means of specialized software.

Filter Optimizations

Figure 17:
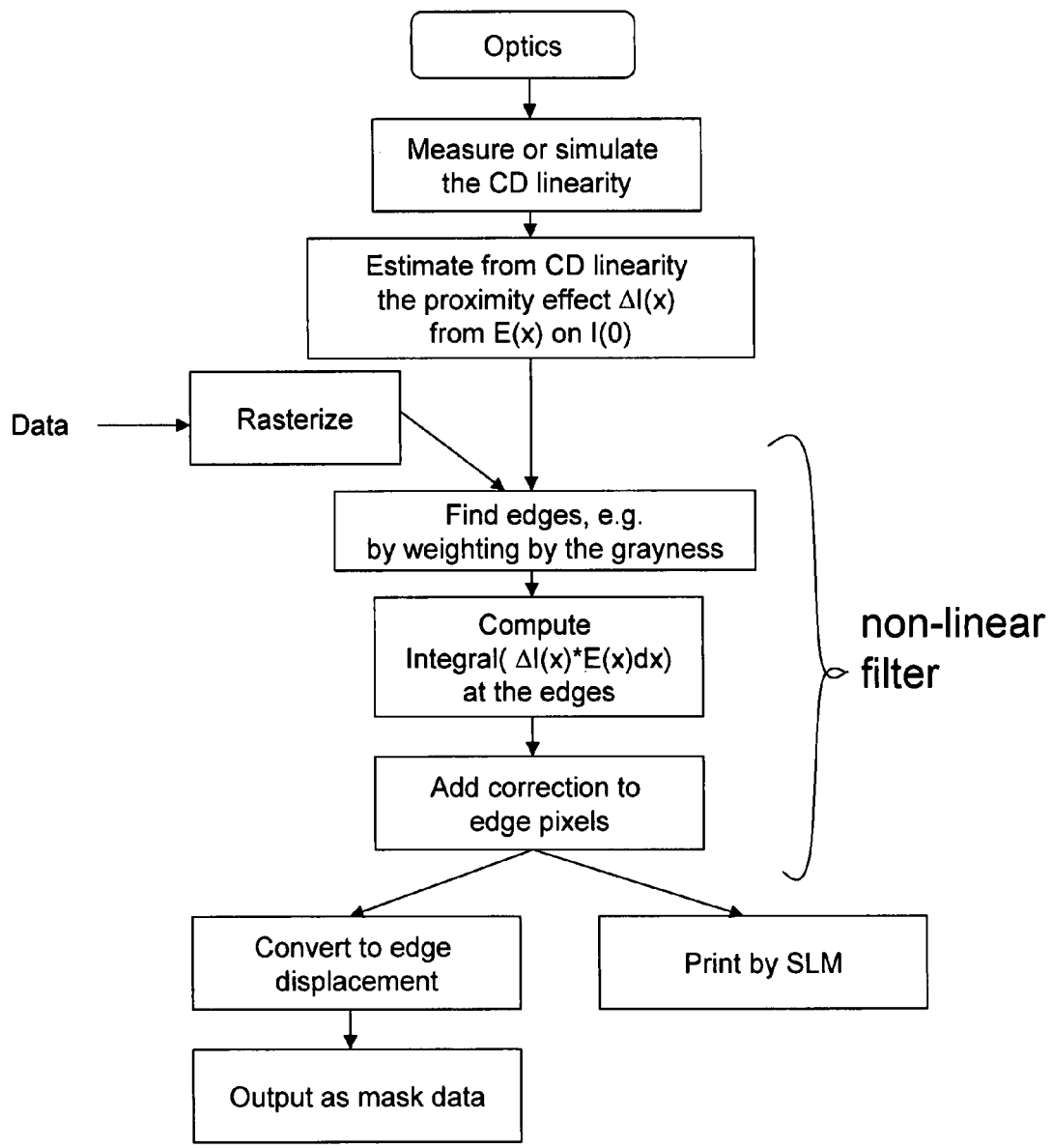
FIG. 17: Flowchart of a method for fast OPC correction, working in the raster domain.
Figure 18:
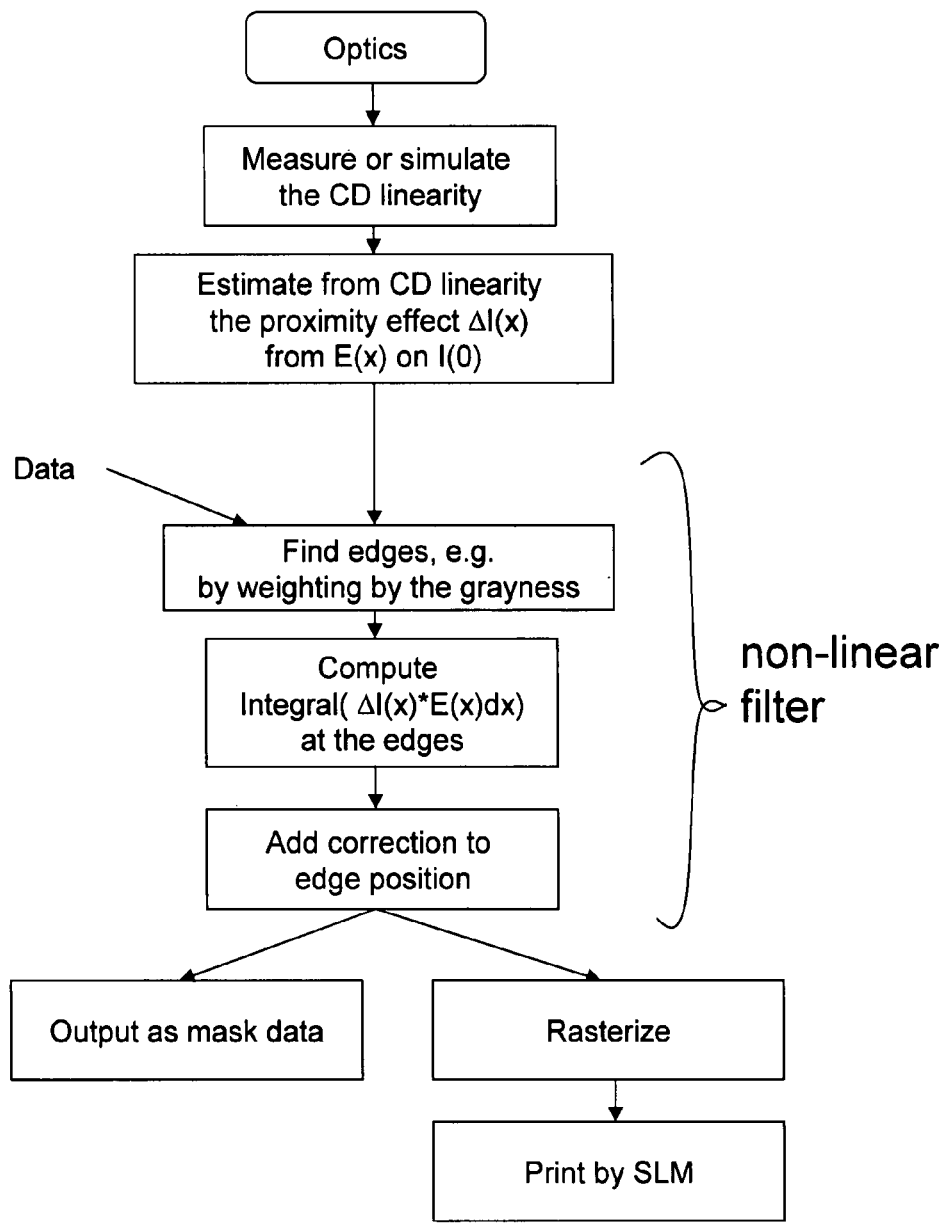
FIG. 18: Flowchart of a method for fast OPC correction, working in the vector domain.

FIGS. 17 and 18 show the structure of the optimization program. It has two parts, the image simulator and the non-linear optimization routine, wrapped in a shell program that administrates the data flow and input/output written in, for example, MATLAB.

The image simulation routine can be a commercial image simulator, see above, or a custom-developed routine. There are a number of known ways to compute the image, e.g., by the so-called Hopkins' method or by propagation of the mutual intensity. Commercial software packages that can calculate the printed image from the optical system include Solid-E from the company Sigma. C in Germany, Prolith from KLA and Panoramic from PanoramicTech, both in the USA. For simulation of high-end lithography, the image should be computed with a simulator that is aware of high-NA effects, polarization and the electromagnetic vector nature of the light.

For the non-linear optimization, there are well-known methods and commercial toolboxes, for example in MATLAB and Mathematica and in libraries from NAG and IMSL, all well-known to most mathematical physicists. The optimization routine should handle constraints gracefully. The existence of multiple local optima should also be taken into account. This is no different from optimization in optical design, to give one example, and methods are known to handle these difficulties, e.g., parameter space sampling, simulated annealing, etc. A textbook on the subject is Ding-Zhu Du et al. "Mathematical Theory of Optimization."

The inventors have developed a self-contained code doing both image simulation and optimization in FORTRAN using the IMSL mathematical library for the optimization. The imaging routine has been benchmarked against the high-NA vector model of Solid-E for accuracy.

Merit Function for Filter Optimization

One chooses a merit function for optimization. The number of possible patterns in the neighborhood within, say, 500 nm around an edge is immense and to optimize all of them would be difficult. The inventors have found that analysis of a small set of pattern classes is sufficient for rotationally symmetric aperture functions. This set of classes is one-dimensional lines with different pitch and duty factor. The printed pullback from a corner is a function of how very thin lines print, but the pullback can also be added explicitly to the merit function. Likewise, line-end shortening can be deduced from the properties of lines at the resolution limit, or it can be added explicitly to the merit function.

Figure 14:
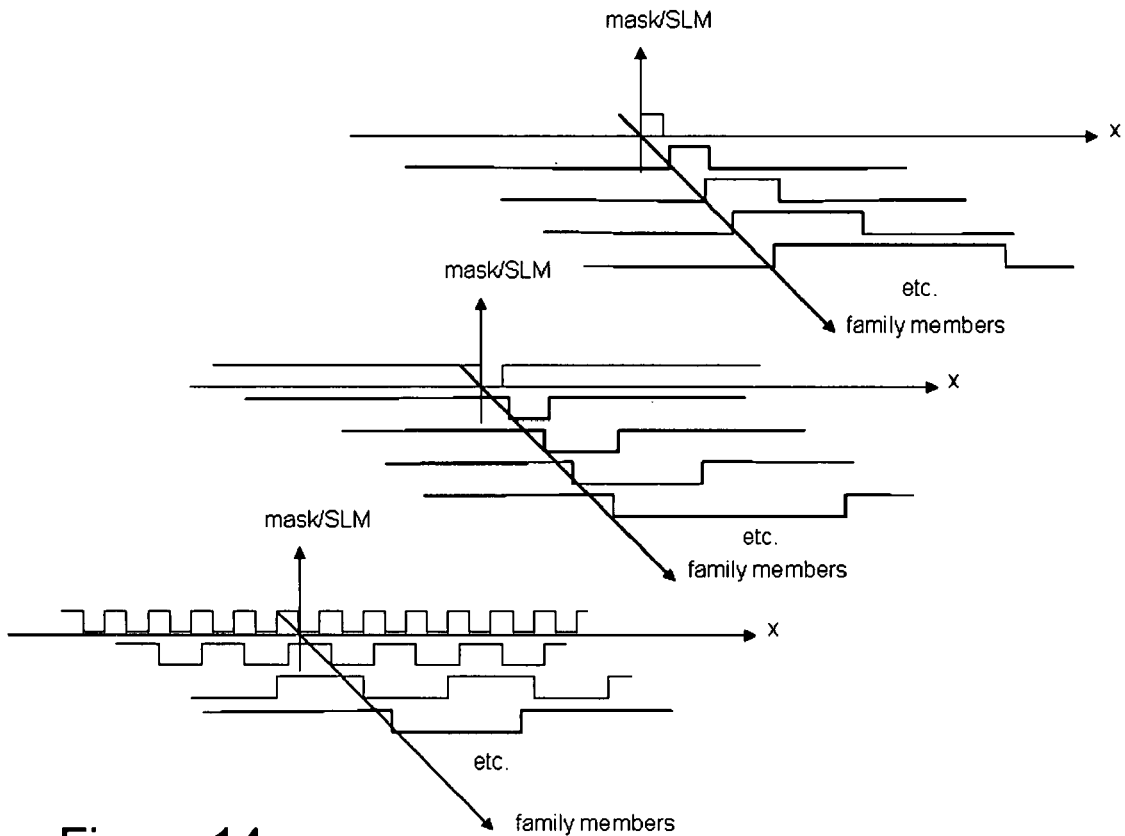
FIG. 14: Three sets of features for simultaneous optimization.
Figure 15:
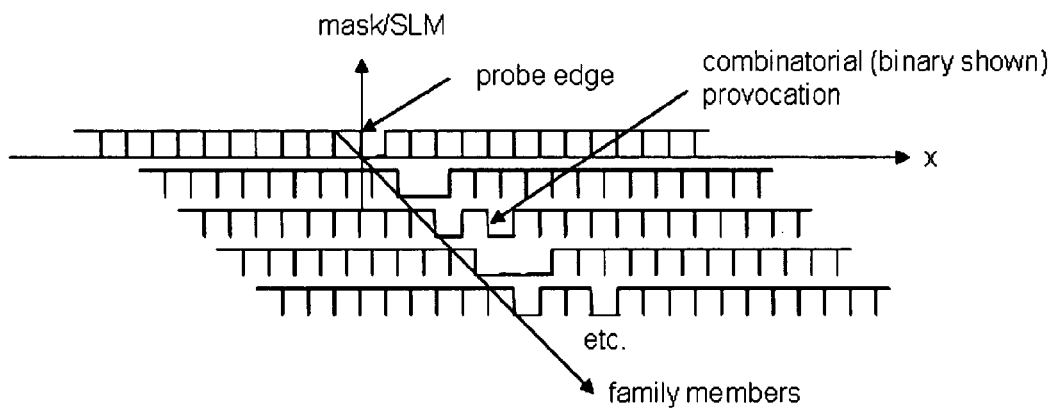
FIG. 15: A single set of features that, if the pixels are smaller than the resolution of the optics, can be used to represent the range of possible patterns.
Figure 21A:
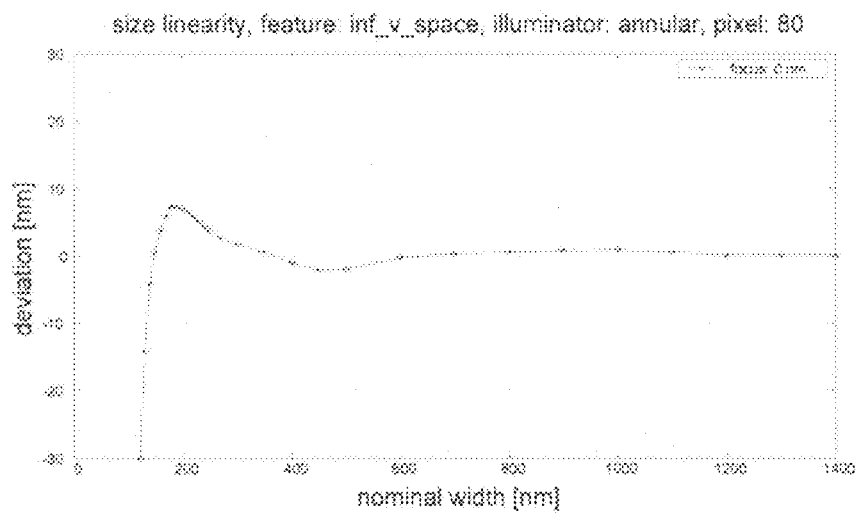
FIGS. 21a-c illustrate the nominal width, in nm, and the deviation from the nominal width, also in nm.
Figure 21B:
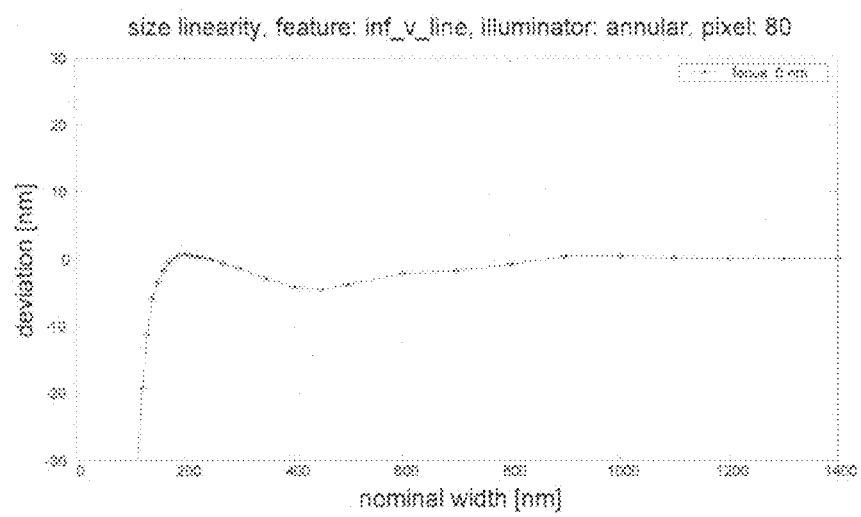
Figure 21C:
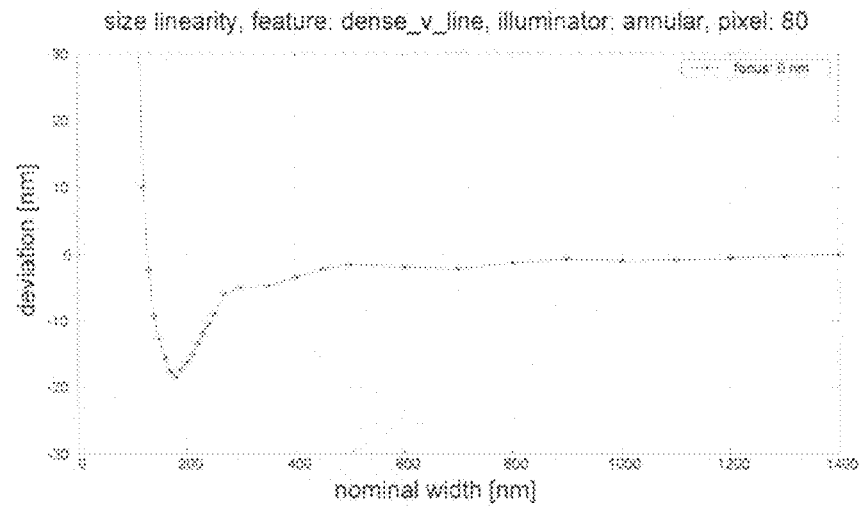

The method can be applied to any set of the representative features, including arbitrary two-dimensional objects, such as contacts, for instance. In particular, the inventors have worked with optimization of three classes of features: isolated dark lines, isolated exposed lines and dense lines and spaces, all with the linewidth varying from below the resolution limit to about ten times larger. See FIGS. 14 and 15. The printed size has been compared to the nominal size and the difference has been minimized over a range of sizes. This is plotted in what we call a "CD linearity plot", FIG. 21. "CD" means Critical Dimension and in this case is the same as "linewidth". Since in applications "CD through pitch", i.e., linewidth errors for lines, usually dark, with constant linewidth but with different line-to-line pitch, is an important quality metric we have also added this as a separate class of features.

The laws of physics couple the ultimate resolution and a CD overshoot at small features. Remove the overshoot and the resolution gets worse; improve resolution and the overshoot becomes excessive. The overshoot is apparent in the space, line and dense graphs, FIGS. 21a, 21b and 21c. It appears as a spike on the Y-axis side of the graph, before the edge intensity deteriorates at the limit of resolution, approaching the Y-axis.

The merit function is set up to fulfill some or all of the following objectives. The first one is to make all lines larger than a specified limit print with no CD errors, i.e., to make the CD linearity plot flat above the limit. If all feature classes satisfy this, there is no influence between edges at a distance larger than the limit. This is a large benefit, since it limits the range of the OPC adjustments needed to make a pattern print accurately. During the OPC processing of a pattern, the computational load depends strongly on the range of interactions that need to be analyzed, and the objective here is to limit that range. We will call it the limit of no interaction.

The second objective is to make the resolution as high as possible, i.e., to make the linewidth where lines no longer print as small as possible. Different criteria for the resolution can be used, e.g., when the line does not print at all or when it has a specific size error. We have been using a size error of −5 nm as the limit. Even if the pattern does not contain lines that are at the resolution limit, this objective is important because if makes all corners sharper and cleaner.

The third objective is to bring lines between the resolution limit and the limit of no interaction within acceptable bounds. Physics does not allow all lines to be printed perfectly and the optimal solution is a trade-off. If the limit of no interaction is allowed to be higher and the resolution limit lower, the intermediate range can be made better. Depending on the application and the tolerances it can be brought within acceptable bounds or it will need some adjustment in the data going to the SLM or to the mask writer in the case of a mask.

FIG. 9 shows four graphs which are the linewidth errors ("CD errors") of isolated lines (unexposed) and spaces (exposed), a dense line/space pattern with 50% duty cycle and a CD through pitch pattern with 130 nm dark features and varying pitch. The lines marked with dots in FIG. 9 are "fences" that are limits outside of which the graphs are not allowed to go. The merit function used in this case allows any variation inside the fences and optimizes the resolution at −5 nm error for isolated clear and dark features. The pitch pattern behaves different from the other patterns, which is natural since compared to the dense pattern it has a wider line and a narrower space below 130 nm in the graph.

Before the optimization, the solution space is scanned for solutions that touch the fence. Several different solutions representing local optima under the constraints of the fences are found and compared. The best one is selected for numerical optimization. The inventors believe that this is a good way of finding the global optimum under the constraints applied. There are more constraints than the fences: the inventors have worked with focal and angular CD uniformity, dose sensitivity and side lob suppression in the image, all with, a constraint on the total transmission. Other methods of finding the global optimum are possible as outlined above.

If the constraints are changed, e.g., the size of the obscuration is changed or the shape of a fence is modified, the shape of the aperture functions changes accordingly. There are several solution branches possible and for some input parameter changes the optimization pursued jumps from one branch to another. Again, this is typical of non-linear optimization and gives the result that small changes in the assumptions and inputs may cause dramatic changes in the optimal aperture functions. The inventors have found that the amount of obscuration has a dramatic influence on the shape of the optimal functions and also on the optimality of the solutions.

Transmission

There is a price to pay for the good fidelity: low optical transmission. Looking at the curves in FIG. 10 showing the aperture functions, one finds that the transmission of the apertures is low over most of the area and that the high-transmission areas do not overlap. The combined transmission is therefore low. Nevertheless, the total transmission constraint can be set to any reasonable level, assuring feasibility of the chosen solution. This is a problem in itself as many printing systems have a throughput that is limited by the available light. It is also a problem because the light that does not reach the work-piece ends up somewhere else and may cause unwanted heating, stray-light and even radiation damage if not properly managed. Any embodiment must address the low transmission.

Derivations for Filter Design and Optimization

Unlike to the case of incoherent imaging system optimization [1,2], the CD linearity curves are not monotonic ones in the presence of coherent light. Thus, the optimization of CD linearity should be done at once for all CD target values and for all printing objects under consideration. The knowledge of the allowed CD linearity error $\delta^{\pm}{}_n(a)$ functions (the merit fences) for all CD target values a and for any objects n is the starting point. These merit fences are determined directly by the printing node requirements (i.e., by 65 nm node requirements, for instance).

The light intensity J in the image of an object n (with CD=a and at the distance δ from the edge) is bilinear form of final lens pupil P and linear form of the illuminator intensity I:

$$J(\delta,a,n)=I_k({}^{pp}F_{lm}{}^{kp}P_l^pP_m^{p*}+{}^{sp}F_{lm}{}^{ks}P_l^pP_m^{*}+{}^{ps}F_{lm}{}^{kp}P_l^s P_m^{p*}+{}^{ss}F_{lm}{}^{ks}P_l^sP_m^{s*})+c.c$$

where $I_k$ is illuminator intensity distribution; $P_l$ is the pupil function for s or p light polarizations; $F^k{}_{lm}(\delta, a, n)$ is optical kernel forms, which can be calculated by using a model of polarized light propagation in a stratified media [2,3], such as air-resist, for instance. Summation over repeating indexes k, l and m is assumed. The pupils $^{s,p}P$ are, in general, the complex functions and asterix * means complex conjugation (c.c). The formula is simplified in the case of polarization independent pupil P:

$$J(\delta,a,n) = I_k F_{lm}^k P_l P_m^* + c.c$$

Summation over different polarization states at the illuminator $I_k$ can be added into the formula in a similar way.

CD linearity profile $\delta(a)$ of an object n is determined implicitly by the equation:

$$J(\delta, a(\delta), n) = J_{thresh} = \text{const}$$

where $J_{thresh}$ is development intensity threshold level. Conversion of the merit fences $\delta^{\pm}_n(a)$ from the coordinates $\{a,\delta\}$ into the new coordinates $\{a,J\}$ is possible since CD linearity error $\delta$ is much smaller than CD value a. FIG. 5 illustrates the conversion of the merit fences into the new coordinates for a given choice of illuminator and pupil functions. The new coordinate system is useful because the CD linearity curves for all objects are transformed into horizontal straight line $J(a) = J_{thresh}$. Note, that the conversion to the new coordinates depends on the choice of the distributions of illuminator and pupils, since the knowledge of the edge profiles of the objects is used for the conversion.

The resolution $CD_{min}$ is determined by the positiveness of the intensity gap (W−B). See FIG. 5. Indeed, the CD linearity curves of all objects will stay within their merit fences if and only if $B < J_{thresh} < W$. The sets of "white" $W_j$ and "black" $B_j$ points can be chosen at new merit fences to represent them. Thus, the optimization problem becomes the standard min-max problem of maximization of the intensity gap (W−B):

$$\max_{\{J_i, S_{P_k}, P_{P_l}\}} \left\{ \min_{\{a_j > CD\min\}} (W_j) - \max_{\{a_j > CD\min\}} (B_j) \right\} \geq 0$$

Figure 6:
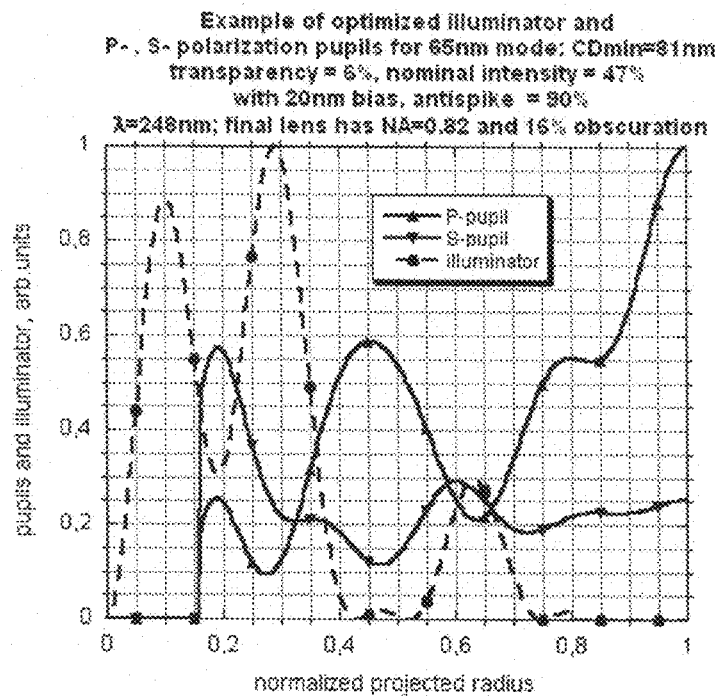
FIG. 6: Aperture functions in a preferred embodiment with NA=0.90, 16% obscuration, lambda=248 nm, and radial (p) and tangential (s) polarization.
Figure 7:
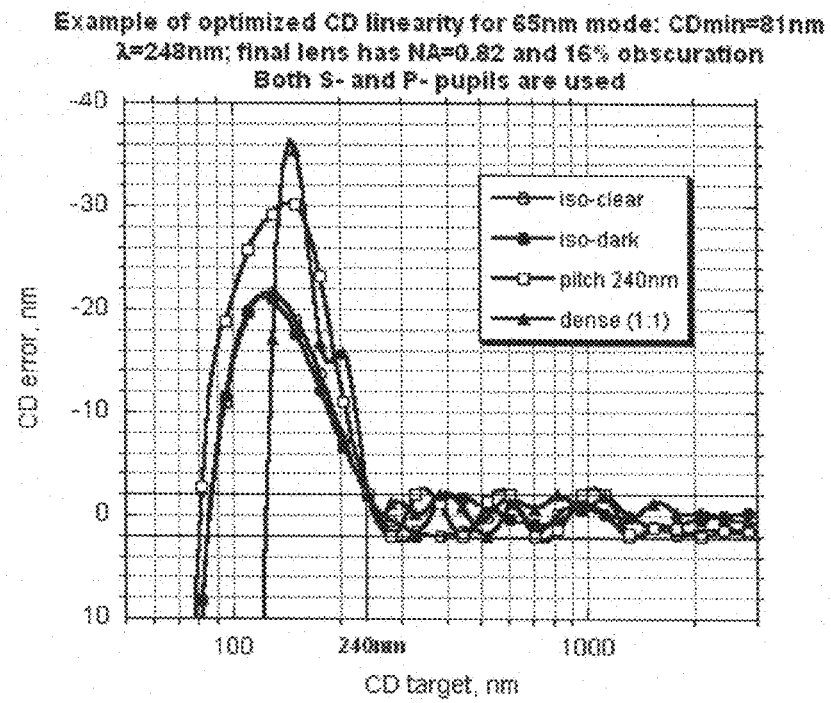
FIG. 7: Corresponding CD linearities.

Moreover, the optimization problem appears to be an iterative quadratic linear programming problem, since all intensity forms $\{W_j, B_j\}$ are bilinear for pupils and linear for illuminator intensity. FIGS. 6 and 7 illustrate the results of optimization for 65-nm printing node (NA=0.82 with 16% obscuration, $\lambda$=248 nm). $CD_{min}$=81 nm is combined with keeping strict CD linearity at CD>240 nm. The polarization pupils were used in the optimization.

The light intensity in the side lobes can be restricted by a fraction $v<1$ of the minimal nominal intensity level B to guarantee the absence of spike appearance in the image. This can be done by application of additional constraints:

$$\max_{\{a_j > CD\min\}} (W_j^{spike}) < vB$$

where $W_j^{spike}$ is the light intensity magnitude at the major side lobe. For, example, 90% "anti-spike" restriction was applied at the optimization in FIGS. 6 and 7. A 20 nm bias was applied as well to increase the nominal intensity level ½(W+B) itself.

If the spherical aberration caused by the presence of resist is compensated, the amplitude pupils only should be used in optimization of the printing resolution at the focal plane. This is because the forms F in (2) becomes the Hermitian ones. Thus, the optical transparency decreases in the optimized system. For instance, only 6% of the light (respectively to the case without any pupil) passes through the optimized system in FIGS. 6 and 7. This can be fixed by adding the additional restriction to the minimum allowed relative level of the nominal intensity. For instance, at least 20% transparency constraints were applied during the optimization shown in FIGS. 8-12.

The examples of self-consistency in the pupil and illuminator distributions are shown in FIGS. 8 and 10.

The optimal pupils and illuminator distributions, as well as the resulting printing efficiency, depend on the final lens obscuration. The central part of the pupil is important in optimization. Only if the obscuration is small enough, the resulting printing resolution is similar to that for the case of the lens without obscuration, compare FIGS. 9 and 11.

Figure 12:
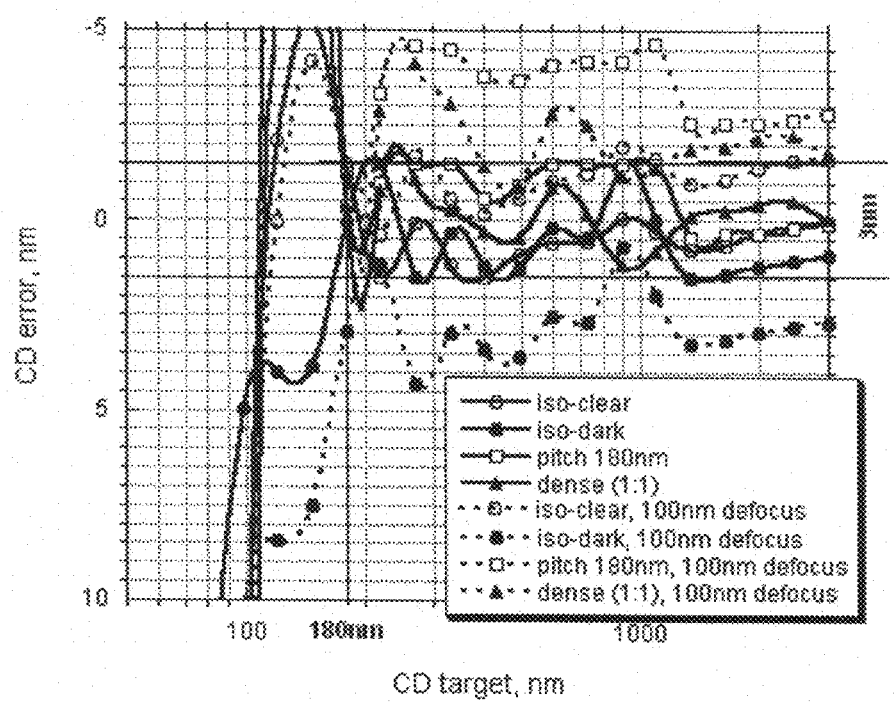
FIG. 12: CD linearity curves using the apertures in FIG. 10 showing the effect of defocus.

CD linearity curves can be optimized not only in the focal plane, but also in whole resist layer by adding into the optimization the additional "black" and "white" points. These additional points correspond to the image in the defocused planes, at the resist top and bottom planes, for instance. FIG. 12 shows the comparison of CD linearity curves in defocused plane. As a result of such enhanced optimization, the nominal intensity ½(W+B) tends to the value of iso-focal dose in most restrictive region of the merit fence, which is not necessarily the iso-focal dose at semi-infinite edge. The bias application makes large change in nominal intensity (compare FIGS. 6 and 8) and, hence, is useful in the improvement of focal uniformity.

Implementation of the Filters

One way to implement the aperture transmission functions in FIG. 10 is to use a variable-transmission filter, for example created by a varying thickness of an absorbing film on a substrate. For the illuminator, the phase of the filter has no importance and a filter with a varying absorber film would work. For the projection filter, the phase is important. Even variations from the intended function as small as 0.01 waves are significant and affect the optical quality of the image. A varying absorber film cannot be made without phase variations. A better alternative is to use a varying absorbing film and to compensate for the phase variation either in the surface of the substrate or by a second film with varying thickness. The absorbing film can be made from molybdenum silicide and the variation in thickness can be created during deposition or by an etching or grinding step after deposition. If an additional varying film is used, it can be of quartz and either deposited or etched or polished to the desired thickness variation. If the phase effect is corrected in the substrate surface figure, the variation can be created by selective etching or by selective polishing. A further possibility of creating gradual phase and magnitude variations is by irradiation by energetic rays such as electrons, ions and or high-energy photons.

Depending on the optical system to which the disclosed technology is applied, it may or may not be allowable to absorb the energy in an absorbing filter. The heating by absorbed energy may cause the optical components to change in an unacceptable way and the absorption may in the long run change the optical properties of the absorbing film, creating a lifetime problem. A different type of filter has a graded reflectivity for the light. Again, for the illuminator filter, the phase has no effect. For the projection filter, the phase must be controlled to the desired function. The variable reflector can be designed by standard methods in the industry. A typical design would have two reflective dielectric stacks with a spacer with a varying spacer film. It can be viewed as a Fabry-Perot interferometer, where the pass band is moved in and out of the exposure wavelength range by the change in mirror spacing. This design will have as a side effect that the transmitted phase varies with transmission. As in the case with the absorbing filter, a correcting phase variation can be added to the substrate or to an auxiliary film.

In the Sigma7300 mask writer, there is an accessible aperture plane between the object (the SLM) and the image (the resist). This is because there is a relay creating an intermediate image in this system and the aperture plane in the relay is optically equivalent to the aperture plane in the final lens. The projection filter can be placed in the accessible aperture plane or close to it. Other projection systems may or may not have an accessible aperture plane. In particular, lithographic steppers and scanners have aperture planes inside the incredibly delicate final lens assembly. Furthermore, putting a filter inside the lens would generate unwanted heat and/or stray light.

Figure 19A:
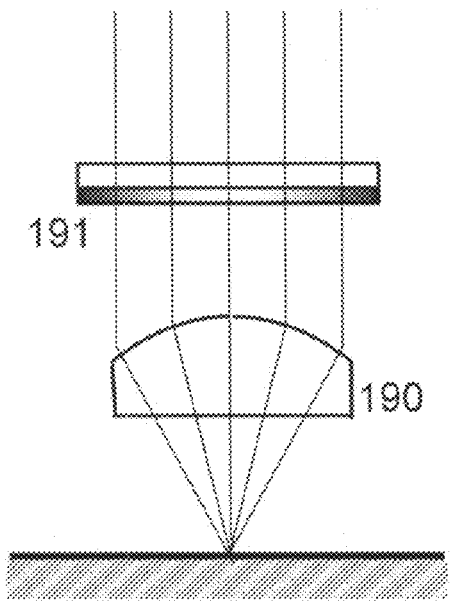
FIG. 19a: Two equivalent ways of implementing a pupil filter in the projection aperture.
Figure 19B:
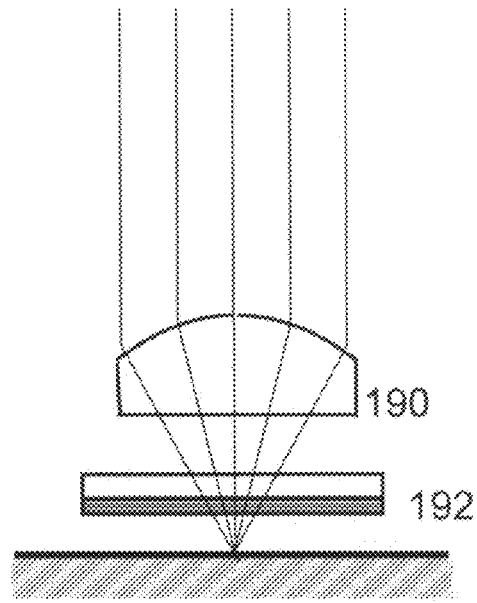
FIG. 19b: The same effect is achieved with a filter 192 with an angle-dependent transmission in a plane where the beams are converging, here close to the image plane.

The aperture filter with a spatial variation (FIG. 19a) of the transmission can be converted to an equivalent filter with angle dependence of the transmission (FIG. 19b) and placed near one of the object or image planes. FIG. 19 shows the two different types of filters and where they can be placed. The filter with angle-dependent transmission (FIG. 19b) can be designed as a more complex Fabry-Perot filter. It can have more than two reflecting stacks and spacing between them. The design can be made with commercial software such as Film Star from FTG Software, NJ, USA or The Essential Macleod from Thin Film Center Inc., AZ, USA.

The Projection Filter

The projection filter is phase sensitive and should have a well-specified phase function versus the aperture coordinate. In many embodiments, the complex function is or can be made to be stay on the real axis. A further limitation is that it is positive real, i.e., the phase is everywhere constant zero degrees. The filter function is then an intensity transmission in the range 0-100%. A way to implement such a function is by a division-of-wavefront beam splitter, i.e., a pattern with areas that transmit the light and other areas that absorb or reflect it. The pattern creates diffracted orders that destroy the image unless they have high-enough diffraction angles to miss the image. An image field stop is inserted before the image to block unwanted stray light outside of the image and it can also block diffracted light from the pattern on the division-by-wavefront beam splitter. The filters may be tilted to reflect back-scattered light out of the optical path. Elements of the patterned filters can be shaped (elongated, for instance) to create both desired s-(azimuthal) and p-(radial) distributions of the light polarization. The design of the beam slitter has to be made with the diffraction in view and will be similar to the design of a diffractive optical element. The non-diffracted light should have an intensity consistent with the desired aperture transmission function. The first order diffraction should miss the image for all used illumination angles. The blocking portion of the beam splitter can be a metal film (e.g., chrome), an absorbing film (e.g., MoSi), a reflective thin-film stack, or not be blocking at all: a dense pattern of phase-shifted structures can be used to modulate the transmission according to the desired aperture functions. The design of the pattern can be done analytically or numerically by methods well-known in physical optics and by designers of diffractive elements. The illuminator filter can also be made by a division of wavefront filter.

The Illuminator Filter by DOE

Figure 20A:
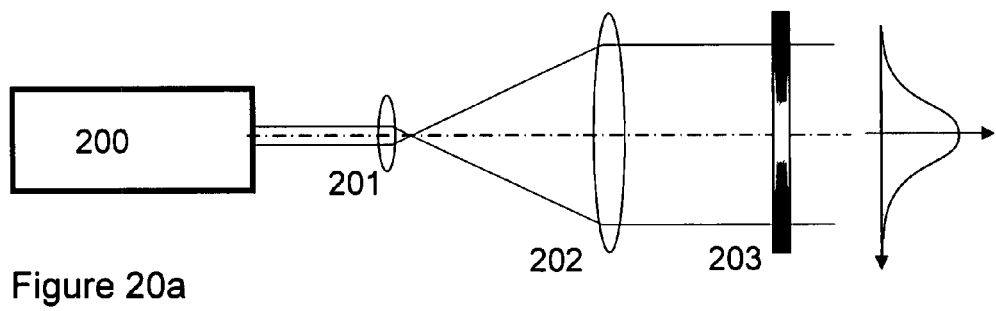
FIG. 20a: Two ways of achieving the same intensity distribution in the illuminator aperture.
Figure 20B:
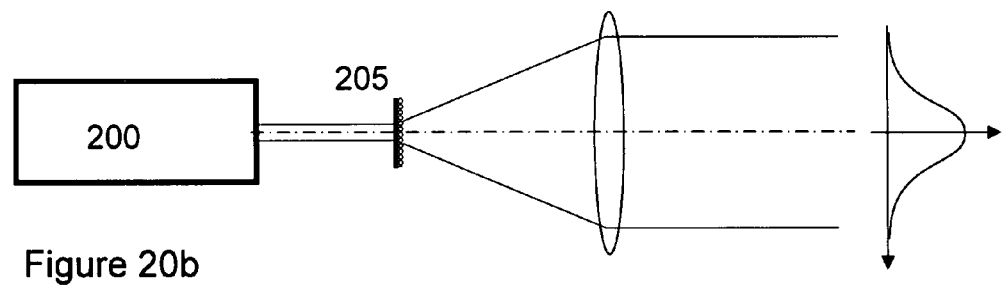

If the illuminator filter is implemented as a real filter, much of the power from the light source is thrown away. We have found that it is better to distribute the light so that essentially the entire light beam from the source reaches the object, but with the desired angular distribution. This is done as shown in FIG. 20. A diffractive optical element (DOE) spreads the beam into the desired pattern in the illuminator plane. Often, a homogenizer is needed to assure that the object plane is uniformly illuminated. With a properly designed homogenizer, the DOE can be placed before the homogenizer and the intensity distribution is preserved through it. An example is an integrating rod ("kaleidoscope"), which is angle-preserving, and an imaging lenslet array homogenizer, which transforms the distribution at an input plane into angle at the homogenized plane.

What has been said about transmission filters above can also be implemented as reflection filters with no change in function or principle.

Polarization

A better optimization can be achieved if one or both aperture functions are defined by polarization properties. There are two reasons for this:

First, it is known that the constructive interference of light at the focus is less effective for the p than for the s polarization at high numerical aperture. This is particularly true for NA above 1, i.e., the hyper-NA condition encountered in immersion lithography. By promoting the s polarization at high angles, it is possible to maintain high contrast imaging at very high NA.

Second, making use of polarization resolves some of the basic trade-offs in the optimization of the aperture functions. Without polarization, every point in the apertures contributes to the image of lines in all directions. With polarization control, it is possible to emphasize certain zones of the aperture for the printing in a specific direction, and another zone to another direction.

The optimization is similar to the scalar one. A polarization-aware imaging routine must be used and the four polarization parameters of the Stokes vector are allowed to vary as functions of the illuminator aperture coordinate. The projection aperture can be represented by a Mueller matrix at each point plus an absolute phase. The Mueller matrix transforms the incoming Stokes vector in terms of intensity, degree of polarization and polarization parameters, plus it adds a phase delay to the light. The imaging routine must be capable of using the light field defined as Stokes vectors, either explicitly or implicitly.

Some thought needs to be directed to the implementation of the semicontinuous polarization filters. Polarization in the illuminator can be achieved by a division of amplitude polarizer, i.e., splitting the beam and using different polarizing filters on different parts of the beam. For example, a fly-eye integrator can have different polarizers for different fly eye elements. Implementing a polarization-selective filter in the projection system is more difficult. One possibility is to use different polarizing filters in different areas in the projection pupil stop. A more practical way is to make use of the large spread in angles on the high-NA side of the lens and make a thin-film filter with angle dependent polarization properties. If the relative reflection of polarization states is controlled by the angle, the average reflection or transmission can be tuned with an absorbing filter. Finally, nano-optical devices with oriented microstructures can be used in the aperture planes or other planes as polarizers, waveplates or polarization-dependent scatterers. For example, a plate with fine metallic needles, 50 nm or less in width, placed in the projection pupil, will act as a full or partial transmission polarizer with a degree of polarization and a polarization direction that can change over the surface in a predetermined way.

Adjusting Adjacent Pixels to Reduce OPC Feature Requirements

The linewidth range between the limit of no interaction and the resolution limit cannot be printed without errors depending on neighboring features and edges. (This is, in fact, the definition of the limit of no interaction.) However, this adjustment is much easier than full OPC and involves only closest-neighbor influences, perhaps just an edge bias depending on the distance to the next edge on each side.

In a maskwriter or direct-writer with one or several SLMs, the pattern adjustments at this intermediate interaction length can be done in the bitmap based on local information available in the rasterizer during the raster processing. Such operations can be implemented in high-speed programmable logic and can be pipe-lined with other data processing, i.e., they occur concurrently with the rasterization and add no overhead or pre-processing time to the job. In an alternative datapath architecture, based on rasterizing to memory by one or several processors before the pattern, the local bitmap operations can either be pipe-lined to separate processors or done subsequently to the rasterization by the same processors. The first case generates little delay, the second case does add significant delay, but a delay that may be acceptable given the fidelity improvement and constraints and trade-offs in the specific case.

The OPC pre-processing needed without the technology disclosed is much larger due to the long interaction ranges created by aggressive illumination schemes (quadrupole, dipole, etc.) Several features affect every edge and the pre-processing needs to be done in the vector domain, i.e., in the input data file. Furthermore, changes in the input pattern created by the OPC pre-processing often make a new design-rule check necessary and can lead to an iterative workflow which increases the effort further. With the technology disclosed, the processing can still be done in the vector domain, e.g., in the data input to a maskwriter, but the OPC pre-processing workload is smaller and faster. After the optimal functions have been applied to the aperture filters, the remaining errors are small and need little adjustment, if any.

Going back to the bitmap processing for a maskwriter or direct-writer, the corrections are rather small and have a simple relation to the features inside the limit of no interaction. A suitable method to do the correction is by convolution of the bitmap by a kernel that corrects for the residual errors. Such bitmap operations have been described in relation to SLMs with negative complex amplitude in a patent application by the same applicant. However, the bitmap operation for correcting residual CD-linearity errors need not be limited to SLMs using negative amplitude. Any bitmap representing an image can be corrected for short-range interactions in the same way.

In a further elaboration, the bitmap operations are asymmetric between light and dark features, so that exposed and unexposed thin lines get corrected by different amounts. This can be implemented by a modified convolution, where the added adjustment of a pixel is a non-linear function of the values of the neighbors, possibly also of the value of the same pixels.

The curves in FIG. 9 are generated from the image formed in the resist, not from the developed resist image. In the simplest model of the resist, the entire thickness of the resist is dissolved (in a positive resist, opposite negative ones) when the exposure dose is above a threshold dose at the top of the resist. A real resist has a somewhat more complex behavior with non-zero optical absorption, finite contrast, geometric transport-limitation and shadowing during the development and etching, plus a range of reaction and diffusion phenomena during the post-exposure baking (chemically amplified resist). Typically, thin spaces (exposed lines) are more difficult to form in the resist than lines (unexposed). The optical absorption in the resist makes the space narrower towards the bottom of the resist and progressively more difficult to develop. As a pre-compensation for this, it is advantageous to allow the optical image of the exposed lines to have higher positive linewidth errors than unexposed ones in the intermediate linewidth range.

With bitmap processing (and also processing in the vector domain,) it is possible to adjust the two types of lines differently to pre-compensate for the effects of the resist. Since the processing of data is a software or programmable operation, it is possible to measure the errors created by the process and include them in the adjustments of the data. This gives flexibility to the combination of optimized aperture functions and tuned adjustment of the data that can yield close to perfect printing results on real patterns with little or no pre-processing. The inventors believe that general arbitrary patterns can be printed neutrally with errors consistent with industry roadmaps down to less than 0.3* lambda/NA.

Derivation in 1-D of the Interaction Expressions

We will now derive an approximate expression for the CD linearity for an arbitrary 1D feature. The goal is to make the change in intensity I at the first edge at x=0 zero for an incremental change in linewidth at the other edge at x=L.

Let's call the complex point (or rather line) spread function $K(x, y)$, the electric field in the object plane $E(x, y)$, the electric field in the image plane $E(x',y')$ and the translation-invariant mutual intensity function in the object plane $J(x_1-x_2, y_1-y_2)$.

Then according to Hopkins (B. Salik et al., *J. Opt. Soc. Am. A* Vol. 13, No. 10 Oct. 1996).

$$|E(x', y')|^2 = \iiiint E(x, y)E^*(\tilde{x}, \tilde{y})J(x,\tilde{x}, y,\tilde{y})K(x,x', y, y')K^*(\tilde{x}, x', \tilde{y}, y')dxd\tilde{x}dyd\tilde{y} \quad (1)$$

To get the one-dimensional expression we would need to integrate along the direction of the lines. Although (1) may not in a strict sense be separable in x and y we make the approximation for one-dimensional objects $$|E(x')|^2 = \iint E(x)E^*(\tilde{x})J(x, \tilde{x})K(x, \tilde{x}')K^*(\tilde{x}, x')dxd\tilde{x} \quad (2)$$

If we add a surface element at x=L we need to replace $E(x)$ with $E(x)+E(L)\delta(x-L)$ and we get the new intensity $$|E_+(x')|^2 = \iint [E(x)+E(L)\delta(x-L)][E^*(\tilde{x})+E^*(L)\delta(\tilde{x}-L)]J(x,\tilde{x})K(x,x')K^*(\tilde{x},x')dxd\tilde{x}, \quad (3)$$

The difference between (3) and (2)

$$\Delta I(x') = |E_+|^2 - |E|^2 \quad (4)$$

$$\approx E(L)K(L, x')\int E^*(\tilde{x})J(L, \tilde{x})K^*(\tilde{x}, x')d\tilde{x} +$$

$$E^*(L)K^*(L, x')\int E(x)J(L, x)K(x, x')dx$$

If J is real (i.e., if the illuminator source is symmetrical around the axis) then $$\Delta I(x')=2*Re(E^*(L)K^*(L,x')\int E(x)J(L,x)K(x,x')dx) \quad (5)$$

Finally, place the pattern so that the probed edge is at x=0:

$$\Delta I(0)=2*Re[E^*(L)K^*(L)\int E(x)J(x-L)K(x)dx] \quad (6)$$

When we add the pattern element $\Delta L$ at L, the width of the feature increases by $\Delta w_0=\Delta L$. On top of that the edge at x=0 moves by the effect $\Delta w_+$ of the coupling from L to 0. The total increase in feature width can be expressed as $$\Delta w=MEEF*\Delta L=\Delta w_0+2\Delta w_+ \quad (7)$$

Equation (7) is a definition of MEEF (at magnification=1) and the factor 2 comes from the mutual influence between the edges. $\Delta w_+$ can be expressed as $$\Delta w_{\pm} = \pm \Delta I \frac{dw/2}{dI} = \pm \Delta I / (ILS * I(0)) \quad (8)$$

where the sign depends on the polarity of the feature and ILS is image log-slope. We can identify $$MEEF = 1 \pm \frac{dI}{dL}\frac{dw}{dI} \quad (9)$$

We can get the CD linearity error at the linewidth w by integration from infinity where the error vanishes by definition $$\Delta CD(w) = \int_{\infty}^{w} (MEEF(\tilde{w}) - 1) d\tilde{w} \quad (10)$$

From (10), we see that flat CD linearity is the same as MEEF=1 everywhere, i.e., $\Delta I(0)=0$ for all linewidths L in (6). We want all features to print with flat CD linearity, i.e., $\Delta I(0)=0$ for all $L > L_{flat}$ regardless of the function E(x), where $L_{flat}$ is a minimum linewidth we wish to print. Then (6) need to be zero for all functions E(x). If we could make the constant part of (6) equal to zero for all values of L we would have a perfect printing system. However, this condition is the same as having an infinitely narrow K or infinite resolution. The width of K(x) is finite and limited by the numerical aperture of the system. We need to make the best of the situation by reducing the magnitude of the expression by optimization of K(x) and J(x).

For two limiting cases of (6), incoherent $J(x_1-x_2)=\delta(x_1-x_2)$ and full coherence $J(x_1-x_2)=1$:

$\Delta I(0)=2*Re[E*(L)K*(L)E(L)K(L)]=2*|E(L)|^2|K(L)|^2=2*|K(L)|^2$ (incoherent limit) and $\Delta I(0)=2*Re[E*(L)K*(L)\int E(x)K(x)dx]=2*Re[K*(L)\int E(x)K(x)dx]$ (coherent limit) both assuming E(L) =1.

For the incoherent case, the same K(x), i.e., the same pupil function, minimizes the CD linearity error regardless of the pattern. The fully coherent case is more complicated.

The approach we have taken to minimize the CD linearity error for all features is to make a numerical optimization through pitch variations for several families of features: isolated lines and spaces, nested lines and spaces a constant line. See FIG. 14. Other choices would be double lines, double spaces and a line or a space adjacent to an infinite edge. Since each family probes a number of locations (see FIG. 15) and the functions K and J can not vary more rapidly than determined by the NAs of the illuminator and projection optics, it is reasonable to believe that a reasonable number of suitably chosen families of features will fence in (6) enough to make any feature print well. Optimization for a single feature or feature family will give a more ideal result for that feature, and simultaneous optimization for many features will yield a compromise. We have found that the simultaneous optimization of several feature families through varying linewidth will create a neutrally printing system with high resolution.

Derivation: in 2-D of the Interaction Expressions

Using a perturbation method for correction instead of a full calculation helps accuracy. The correction magnitude may be only a fraction of a pixel and the needed relative accuracy in the computation is reduced accordingly, as illustrated in FIG. 22. For example the pixel value can be used instead of the exact amplitude. The perturbation computed is the one between the actual pattern and a reference pattern, an infinite edge. We assume that the dose is set to print the infinite edge at the nominal position, i.e., the intensity is at the threshold value at the nominal edge position. When the pixel value is 50% the edge is intended to cut through the center of the pixel. Therefore we know the intended intensity at the center of the pixel. With a different pattern the intensity is slightly different and we can calculate the difference and correct it by changing the pixel value.

$$V_{corr} = V + w_g V_{pert}$$
$$= V + w_g(sqrt(I_{ref} + I_{pert}) - sqrt(I_{ref}))$$
$$= V + w_g(sqrt(V^2 + I_{pert}) - V)$$

where $V_{corr}$ is the corrected pixel value, V is the value from the rasterizer (assumed equal to the desired amplitude), $V_{pert}$ the perturbation correction, $I_{ref}$ the intensity for the infinite edge, and Wg is a weight factor that will be described below. $I_{pert}$ is the change in edge intensity due to the actual pattern:

$$I_{pert} = I_{ref} - I_{act} \quad (2)$$
$$= I(P_{ref} - P_{act})$$

i.e., the perturbation $I_{pert}$ is calculated from the difference between the reference pattern $P_{ref}$ and the actual pattern $P_{act}$. In FIG. 22, the simple reference pattern is illustrated by FIG. 22a and the actual pattern by FIG. 22b. Corresponding exposure profiles appear in FIGS. 22c and 22d. In FIG. 22c, the edge is where the intensity profile crosses the horizontal guide line. The perturbation, in FIG. 22d, moves the intensity crossing point to the left, as indicated by the vertical dashed line.

In one embodiment, each computation only corrects one pixel, namely a gray pixel sitting on the edge. The method has smallest errors when the pixel value is 50%, and the range of possible correction is also largest in this case. What about edges that pass through a pixel, but not through the center?

The SLM writer writes several passes, typically four, with offset pixels, as illustrated by FIGS. 22e and 22f. The passes are offset in both x and y. For a long edge, one pass will have the edge close to the middle of the pixel. Two other passes will have pixel values around 25% and 75%. The algorithm makes half of the total correction in the first case (most centered pass) and the other half is divided between the second and third case (25% and 75%). A fourth pass, where the feature edge is close to the edge between two pixels, is not corrected. This weighting is uniquely determined by the grayness of the pixel and a weight factor $w_g(V)$ is used. For all fully white or black pixels $w_g=0$ and the computation of the correction may be skipped.

Simplification of the Kernel

The computation of the intensity in an image is well known in the literature.

$$I(x, y) = \int dx_1 dy_1 dx_2 dy_2 H(x_1, y_1) H^*(x_2, y_2) \quad (3)$$

-continued $$J(x_1 - x_2, y_1 - y_2)A(x - x_1, y - y_1)A^*(x - x_2, y - y_2)$$

where x1, x2, y1, y2 are geometric coordinates, A(x, y) is the amplitude, H(x, y) is the coherent amplitude point spread function, and J(x1, x2, y1, y2) is the coherence between the point (x1,y1) and (x2,y2) in the image plane. For a rasterized system it can be written in discreet form:

$$I(i, j) = \sum_{k,l,m,n} H(k, l)H^*(m, n)J(k - m, l - n)A(i - k, j - l)A^*(i - m, j - n) = \sum_{k,l,m,n} K(k, l, m, n)A(i - k, j - l)A^*(i - m, j - n) \quad (4)$$

In the general case the kernel K is four-dimensional and (4) contains $(2*n_{range}+1)^4$ terms, a large number even for small interaction ranges $n_{range}$. For a neighborhood range of four pixels in each direction (a 9×9 grid), the 4-D nature of model yields 130,000 terms for an interaction length of 600 nm. We have to simplify (4) immensely in order to compute it for every gray pixel in a reticle—which could in the worst case be every pixel in a reticle, $10^{13}$ of them.

Figure 23:
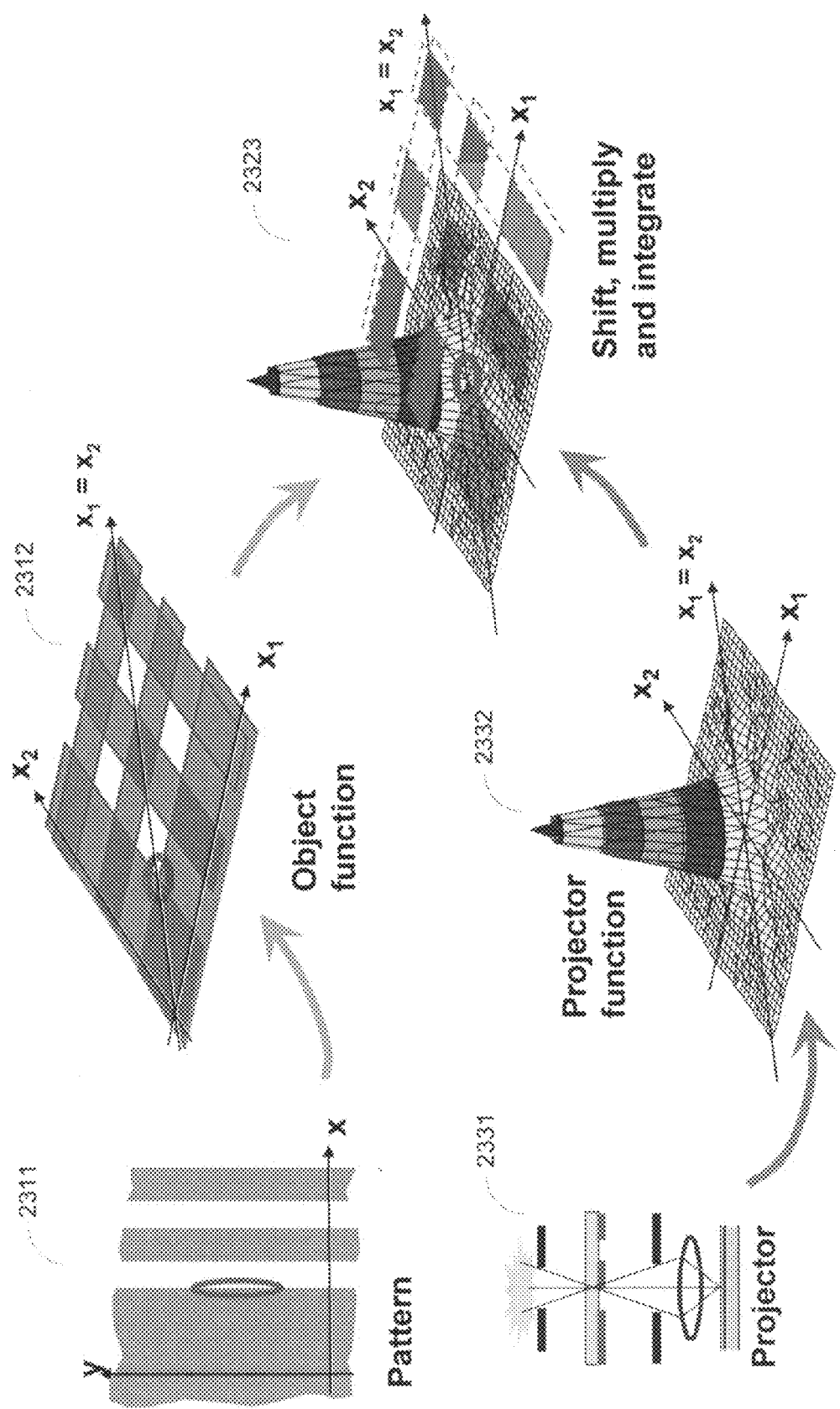
FIG. 23 depicts visualizations for a 1D case of object and projector functions that are integrated to give intensity in the image plane.

The first simplification is to base an approximate kernel on the one-dimensional case (1D image analysis, the kernel is 2D). An elegant graphical representation of one-dimensional imaging has been given by Goodman [4]. We will start with the Goodman case and then generalize to two dimensions. FIG. 23 reproduces Goodman's visualization, applied to the pattern in FIG. 22. The pattern 2311 translates amplitude squared into intensity in an object function 2312. The projector 2311 is represented by a projector function 2312. The object function and projector function are integrated 2323, to calculate the intensity and exposure at the image plane.

Figure 24:
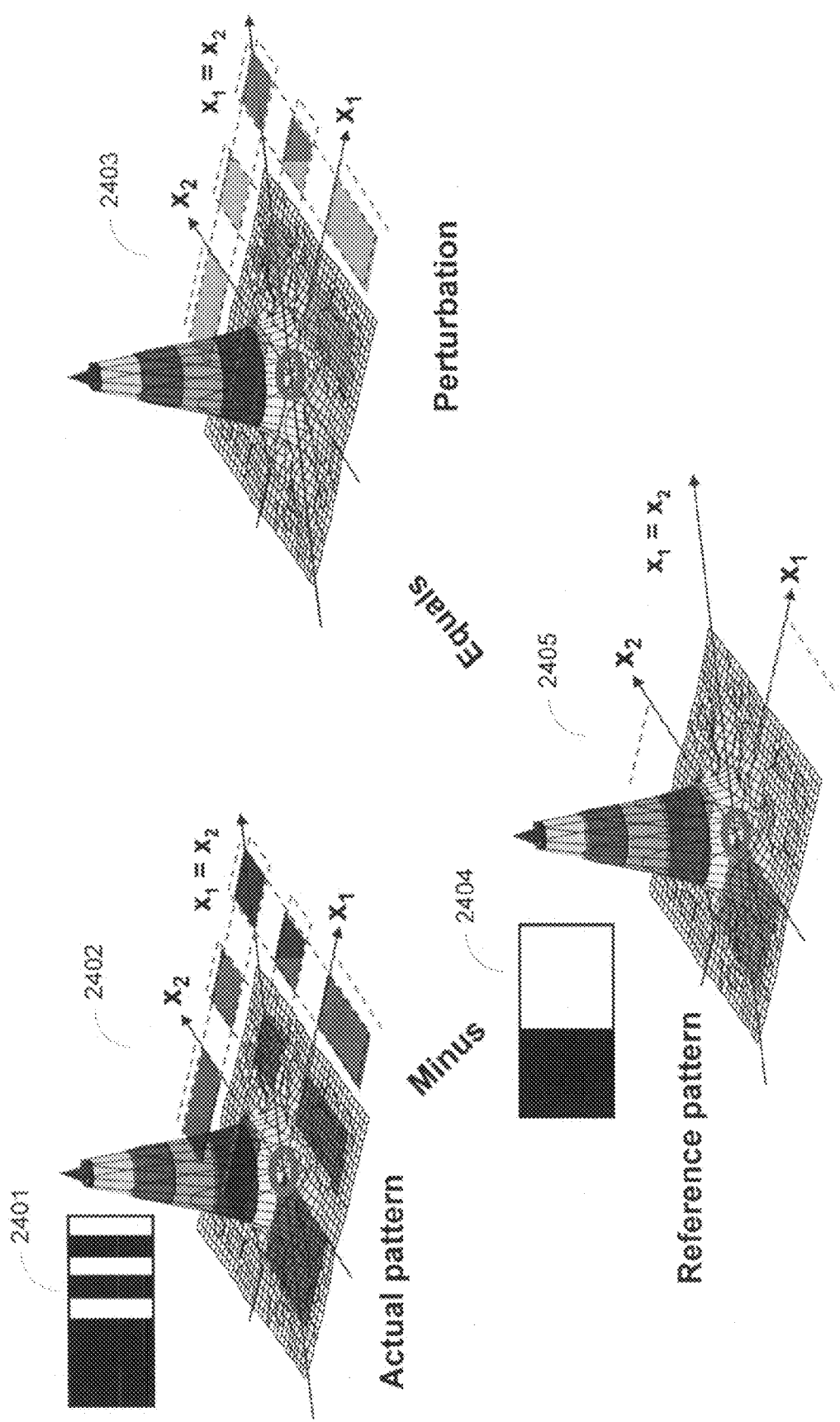
FIG. 24 depicts integration of an actual pattern, minus a reference pattern to equal a perturbation pattern.

FIG. 24 illustrates the perturbation calculation. Removing the reference pattern, which is known in the absence of perturbation, the calculation focuses on how the presence of features in the actual pattern moves the edge of the reference pattern.

Figure 26A:
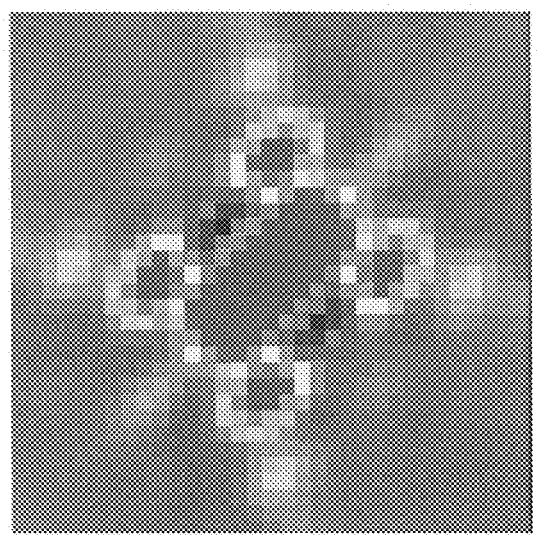
FIG. 26a-b depict an illuminator and combined illuminator/pupil functions.
Figure 26B:
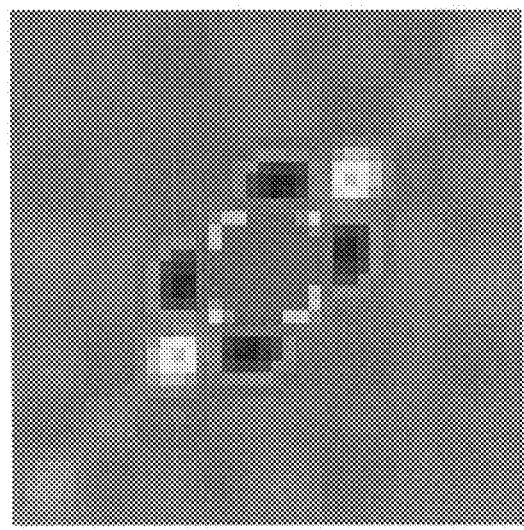

Numerically exercising the analysis depicted by FIGS. 23-24 leads to an optimized pupil function in FIG. 26a and a combined illuminator and pupil function in FIG. 26b. Note that at least FIG. 26b illustrates an optimization that exceeds the mechanical resolution of microelements in an SLM. From these somewhat idealized functions, a kernel function can be selected that can be efficiently applied in a high data rate environment.

Figure 25:
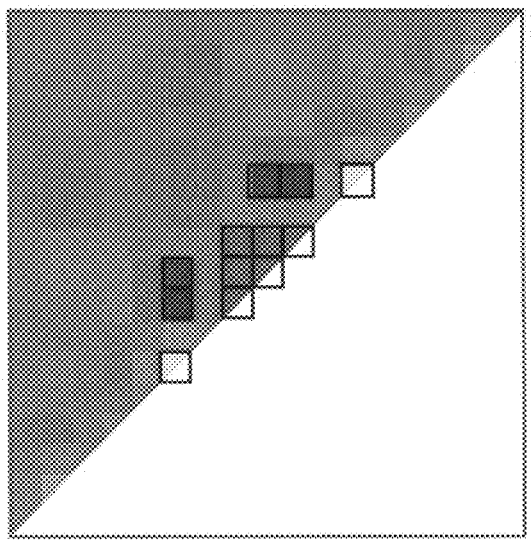
FIG. 25 illustrates for a 1D case selection of kernel elements having a predetermined significance.

FIG. 25 shows a one-dimensional kernel that has been hand crafted. To simplify calculation, the most significant elements are selected. The kernel is surprisingly small.

Figure 27:
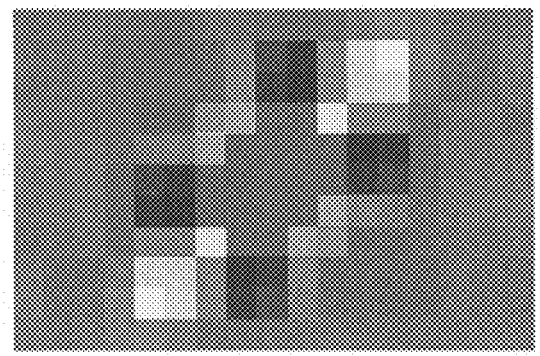
FIGS. 27-28 illustrate the effect of pixel size on kernel values.
Figure 28:
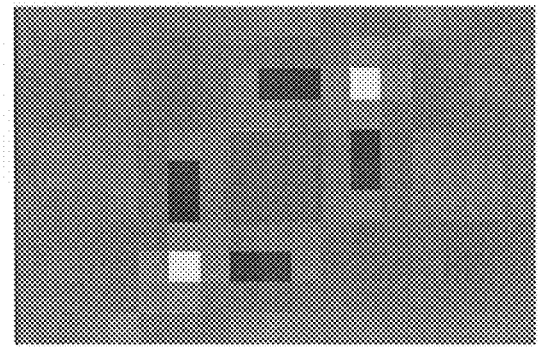

An important step in simplifying the kernel is to select a pixel size in the image plane that maps a pixel onto the hot areas of the kernel. We usually use a rather coarse pixel in the SLM maskwriters. A large pixel gives high throughput, but is prone to through-grid errors. These errors are strongly reduced by the use of multiple offset passes. A large pixel size gives more errors, but a smaller kernel and the correction scheme disclosed have more power. FIG. 27 shows a mismatching pixel size, 55 nm ($k_1$=0.20). The corresponding profile appears blurred. FIG. 28 shows a better-adapted pixel size of 64 or 68 nm ($k_1$=0.25). A pixel size corresponding to $k_1$=0.25 produces a sharp image of the pixels.

The interaction is the same in elements i,j and j,i and we remove the redundant pixels (actually it is the symmetry in the AA* field in (3) that we remove, the kernel has even more symmetries but cannot be removed since AA* differ). Furthermore, we remove all elements that are small and end up with 12 elements. This kernel works for arbitrary one-dimensional patterns.

In either 1D or 2D, two alternatives to crafting a kernel can be used. One approach, illustrated by FIG. 29, is to sort the elements by their magnitude of contribution to perturbation and apply a cut-off, for instance, selecting only those elements that contribute at least 1, 2, 2.5 or 3 percent of the perturbation. Generally, this involves automatically selecting elements that exceed a predetermined threshold of significance. The particular measure and criteria are not essential to this embodiment. This approach is mechanical, requiring little judgment. It tends to give a long list of candidates for inclusion in the kernel. It works for any type of pattern.

The other approach, described above in the context of FIG. 25, involves using a priori knowledge about the symmetry of the pattern to be printed and handcrafting an elegant kernel. In the figures, selection of the right pixel size to produce a sharp correction pattern followed by recognizing how symmetry can be exploited to reduce the number of multiplications by four-fold in the 1D case effectively reduces the number of multiplications required to apply the kernel, reduces the computing demands and allows the method to run faster with any given logic resources.

The Pseudo-2D Problem

Next we teach how to construct a computationally efficient kernel for 2D patterns. The straightforward way is to calculate the entire kernel and take away all redundant and small elements. It would work for any kernel, also non-symmetrical ones. It is of very high value to reduce the number of coefficients in the kernel to the minimum, since the computation power is proportional to the number of kernel elements that need to be used. On the other hand, there is not a single best kernel for all circumstances. The optimum kernel will depend on the lens NA, possible aperture obscurations, polarization, immersion, the pixel size, and the intended patterns to be written and the cost of computation. An example embodiment for mask writing will need a differently reduced kernel than a tool for forming semiconductor devices on wafers (direct writing tool). The kernel can be computed to include higher-order effects like high-NA effects. For polarized lithography it may be necessary to use multiple kernels for different polarization components in the light and add the images.

Kernel elements can be removed based on three principles: they are small enough to be approximated with zero, they are cancelled by surrounding elements of opposite signs for most realistic patterns, or several adjacent coefficients are small and can be accumulated and represented with a single element. The removal of elements of insignificant magnitude is straightforward, and the pupil functions may be optimized to maximize the number of insignificant values. The resulting kernel will have a small number of large elements, a sea of insignificant ones, mainly far from the origin, but there will remain a significant number of elements that are small but not insignificant.

To reduce the kernel further one needs to keep in mind that not all patterns are equally plausible or equally important. The most important pattern types are line-and-space patterns along the Cartesian axes. Second in rank are line and space patterns aligned along 45 and 135 degrees. If these types of patterns are written well, it is very likely that lines and spaces in other angles are under tight control. The reduction of the of kernel can be done by simulation of line and space figures with relevant sizes while elements are being removed, or while the value of one element is added to a neighbor for accumulation into a significant element or for cancellation. This is a numerically tedious process, but it can be fully automated and can be made to run in parallel. The reduction process is highly simplified by the high degree of symmetry in the kernel and in the computation of a line-space pattern. The kernel is known to be invariant under reversal of the signs of k, l, m, and n, as well as under exchange of the x and y axes in the object plane.

The kernel elements can also be determined empirically by looking at how the image changes when only one pixel value is changed. In the Sigma7500, there is a camera that records the image formed by the SLM and this camera image can be analyzed in order to calculate the actual kernel elements.

As an alternative, which we call he pseudo-2D kernel, we have used the radial symmetry of the optics and rotated and added the 1D kernel in four angles (0, 45, 90, and 135 degrees, in FIG. 30) in the x, y plane, plus explicitly added the elements for the interaction between +/−1 in x with +/−1 in y. This kernel, which should give accurate results for lines and spaces in Manhattan and X geometries and reasonable results for corners and line ends, has 39 elements. The selection of elements is depicted in FIG. 31, a two dimensional representation of four-dimensional space. Note that the elements of the 1D kernel have to be modified in the process, since the elements in the 1D kernel are integrals over y, while in the pseudo-2D kernel the y behavior is explicit. The process of making the pseudo-kernel gives an enumeration of the elements to include, but the actual values are taken from the calculated full 2D kernel. The accuracy can be somewhat further improved by a consolidation process where elements included in the pseudo-2D kernel pick up all or part of the values from their nearest-neighbors, which are non-included elements of the full kernel. Of course, it is worthwhile to do a simulation or experimental optimization of the elements of the reduced kernel in order to trade between 1D and 2D and between CD accuracy and CD-through-grid uniformity.

Results

FIG. 32 shows CD linearity with and without the correction. In 32a, the optics is optimized for correction but no correction is applied. In FIG. 32b, the curves in FIG. 32a are corrected using the described method. These results leave room for improvement, which will be described in future applications. The reader should be aware that the result in presented FIG. 32c is the result of optical simulation, not from building and applying the device and method described. On the other hand, manufacturing difficulties do not confound simulation.

Figures 33A, 33B:
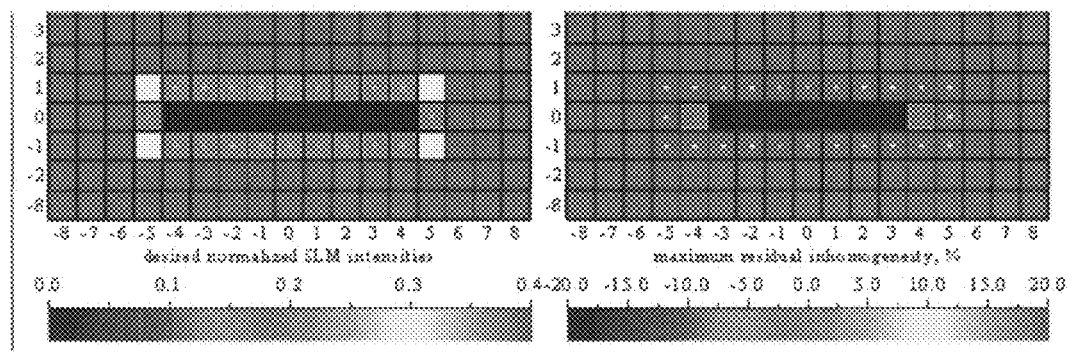
FIGS. 33a-d depict non-corrected and corrected SLM pixel values for generating a line and line ends.
Figures 33C, 33D:
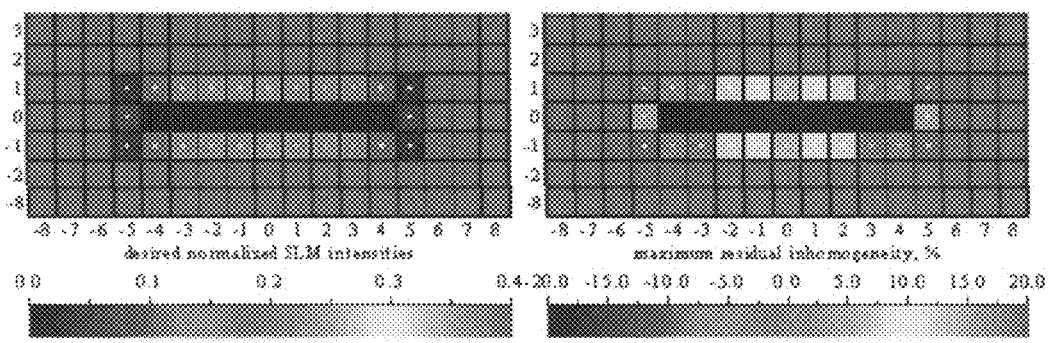

FIG. 33 depicts the expected favorable impact of our teachings on line-end behavior. Rasterizing an isolated line without adjustments (FIG. 33a) produces a narrower line (FIG. 33b) than intended, due to overshoot of exposure surrounding the line. Applying these teachings, the dose is adjusted (compare FIG. 33a with FIG. 33c) and the resulting line more nearly matches the designer's intent (compare FIG. 33a with FIG. 33d.)

Figures 34A, 34B:
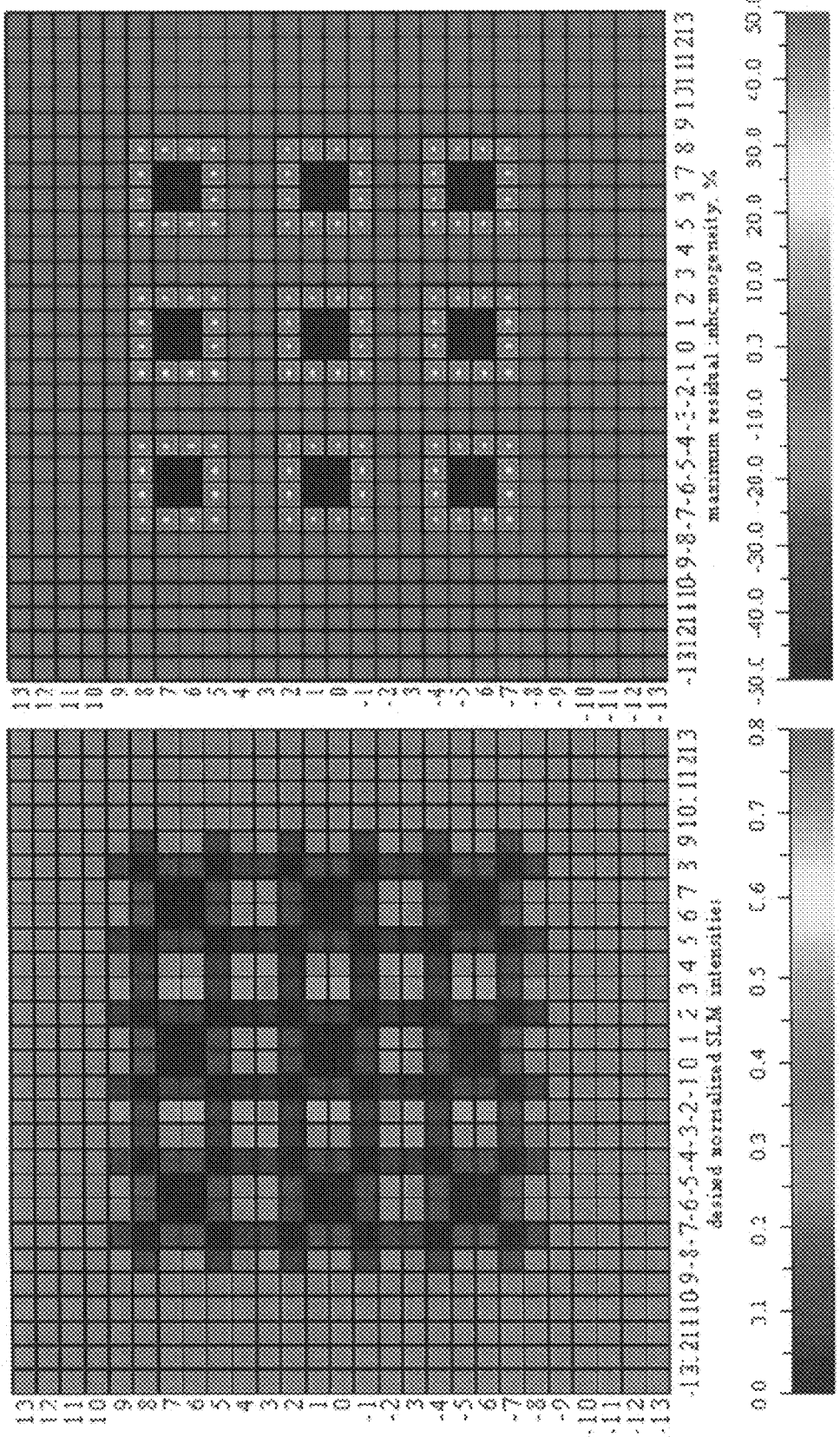
FIGS. 34a-b depict SLM pixel intensities and resulting residuals in the image plane for generating closely spaced contacts.

FIG. 34 depicts the favorable impact of our teachings on neighboring contact points.

Implementation

In an example embodiment, the operations are performed in the pixel domain, focusing on the gray pixels in the bitmap, which in a typical pattern is only a fraction of the pixels. The processing unit could either be designed for the average processing needs in a pattern and process only the gray pixels based on a list, or it could scan through every pixel in the image an have capacity to process each one of them is necessary. The latter design appears far safer since there is no risk of constipation and he logic is simpler. The saving in capacity in the first case is offset by a more complex structure with queues and buffers. Is it possible to design a real-time OPC processing unit with enough processing power to apply calculate the correction in every pixel. Indeed, it is, using the algorithms described above and fast silicon.

The kernel taught above has 39 elements, which correspond to terms in (4) that can be implemented by one addition and two multiplications. The resulting expression can be simplified and the average number of multiplications further reduced to approximately 1.5 per term. A maskwriter with 68 nm pixel and 3 hours typical write time would need approximately 3 Gpixels per second during the writing stroke. The OPC correction thus needs 112 billion additions and 176 billion multiplications per second. This is well within the capacity of at least one commercially available FPGA device, the Xilinx Virtex-4, which has 512 embedded fix-point DSPs plus uncommitted gates to glue the data processing system together, altogether giving 256 billion additions and 256 billion multiplications per second. Even though an actual implementation of embedded OPC might have different parameters and the distributed nature of the data path speaks against a single device, it is interesting to see that a single commercial silicon device has enough capacity to carry out the described OPC correction in a state-of-the-art mask writer.

Real-Time Pattern Correction

Depending on the merit function, many different compromises are possible. By choosing the merit function, one can select a compromise that is better for the particular context. If the merit function punishes all CD errors above 180 nm line or space width, and is more lenient of errors for smaller features, the result will be an optical setup with no long-range proximity effects and size errors for small features. We use such a merit function and reduce the range of interaction in the pattern. With only short-range interaction, the needed OPC corrections will be much less demanding numerically. If OPC correction is done prior to writing the pattern, it runs faster on less expensive hardware and using simpler algorithms. The most exciting prospect is that the OPC correction may be doable in real writing time (mask writer or direct writer). Another opportunity is to tune the optics so that the proximity effects in the patterns are only short-range and can be corrected concurrently with rasterizing or even in real time, e.g., using high-speed FPGAs.

Figure 16:
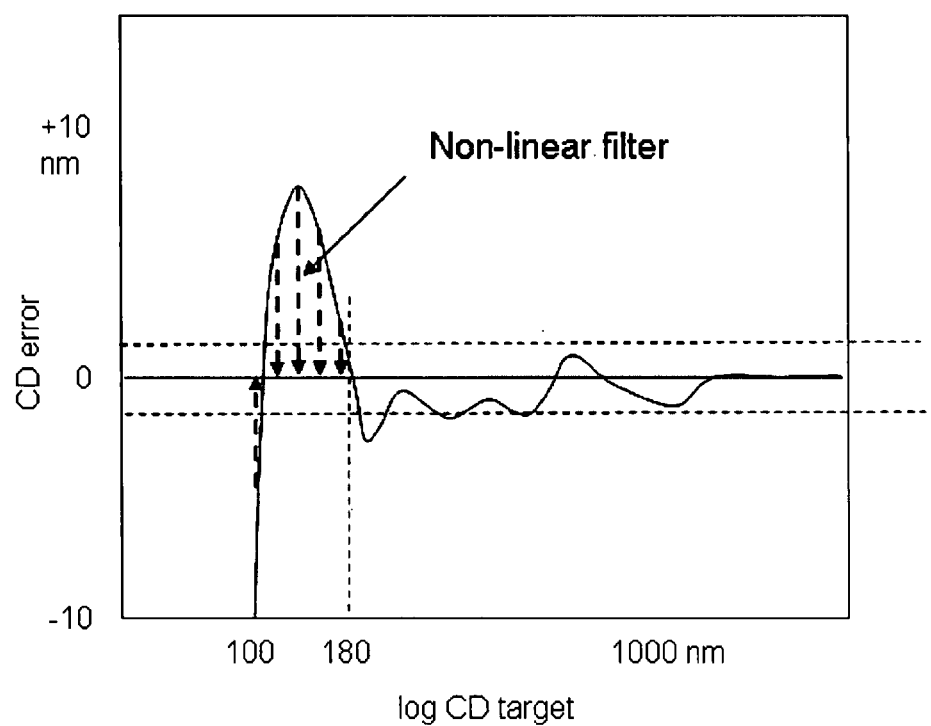
FIG. 16: A non-linear filter that corrects the residual CD linearity error.

A method for performing real-time pattern correction will be outlined in the following. In a printing system based on an SLM, there is a rasterizer and certain mathematical operations on the rasterized data (described in publications and other patents and patent applications by Sandstrom at al.) that convert a vector description of the pattern to a printed pattern with high fidelity for large features. These methods include creating a bitmap based on the overlap between a pixel and the feature in vector data, using a non-linear look-up function to correct for non-linearities in the partially coherent image, converting the bitmap to account for the properties for the SLM pixel modulators, and sending the converted bitmap to the SLM. See FIG. 16. It may further involve some bitmap operations to make corners sharper and to reduce line-end shortening, to make the edge-slope of the aerial image steeper and other bitmap operations to reduce the effects of the finite pixel grid in the SLM. The SLM can be based on phase modulation, amplitude modulation, or polarization modulation and it can be transmissive or reflective. A reflective micromechanical SLM can be based on tilting mirrors or piston-action mirrors. In any case, there is a datapath and algorithms adapted to placing the edges accurately where they fall in the data, at least for large features with no proximity effects.

A real-time proximity correction scheme can be implemented as a perturbation correction to the already quite good data-to-image conversion provided by the data-path, SLM and optics. It need only correct the intensity (or E field) at the boundaries of the features. This means that we need to apply correction only to pixels at the edge or adjacent to it and they can be recognized by their grayness in an analog bitmap. Furthermore, we need only correct for the pattern inside the range of optical interaction, made small by the optimization of the optics.

Figure 13:
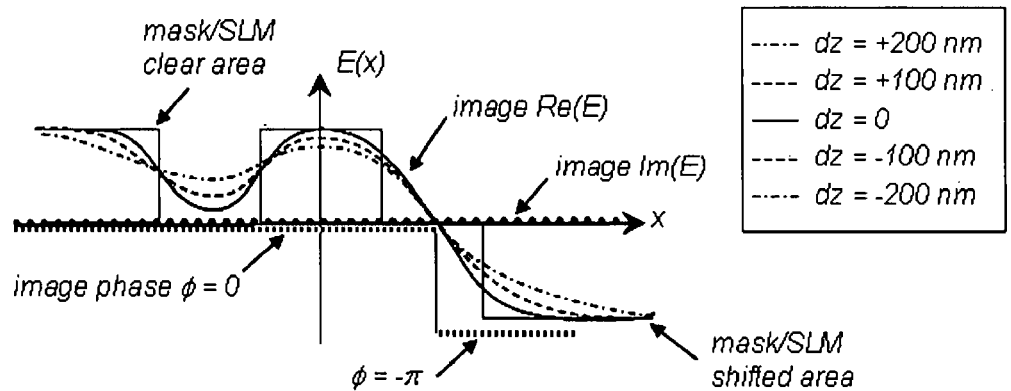
FIG. 13: Three features, two clear and one shifted, the aerial image through focus and the imaginary part of the E field that gives symmetry through focus.

We know that the image has good quality. In particular, this means that the phase of the image is well-known. FIG. 13 shows conceptually three features, two clear and one shifted by 180 degrees. It also shows the aerial image at best focus and at two focus positions on either side of best focus. If the image has good quality, the images on either side of best focus are essentially identical (lines cover each other in the figure). For this to occur, the imaginary part of the E field must be zero. The E field must be real and have a phase angle of either 0 or 180 degrees. The phase of the E-field at the edge, where the photoresist (or other light-sensitive substance) is exposed to the threshold intensity, is therefore known. It can be only 0 or 180 degrees and we know from the data (or mask) which of the two values we have. We know J and K, we know E in the object and we know the approximate value of E at the edge in the image (either 0.5+0.0j or −0.5+0.0j). We, therefore, have everything we need to calculate the perturbation from Equation (2) due to the pattern within the range of interaction. If the interaction range is small, this is only a few pixels, e.g., 7 by 7 pixels, and the calculation can be done either in a high speed general purpose processor, a signal processor, an FPGA or custom logic. The operations are easy to compute in parallel and to pipeline, making an implementation with high capacity possible. When several passes are printed with an offset pixel grid, it is possible to apply the correction in all passes or only in those passes where the edge pixel is close to mid-gray. A compromise with more correction in those passes where the edge is off-grid (i.e., gray) is beneficial since it does not need to imply exposures outside of the dynamic range used elsewhere in the pattern.

It is a further embodiment to provide hardware, software and/or firmware to do a real-time correction at small distances by determining the approximate perturbation of the intensity at an edge due to the pattern. The interactions are made short by the optimization of the optical filters. The interactions as functions of radius can be found from simulations using programs like Prolith or Solid-E or it can be deduced from CD linearity experiments.

In a preferred embodiment, one or several of the following operations are done: rasterization of vector data to a bitmap (possibly in a compressed format: zip, run-length encoded, etc.); adjustment of the bitmap for the physics of the SLM and optics; adjustment for process bias and long-range CD errors due to stray light, density, etch loading, etc.; sharpening of corners; removal of the effects of the finite pixel grid; sharpening of the edge acuity and adjustment of the exposure at the edges for proximity effects.

In a work-flow based on masks or reticles, a similar procedure can be used to simplify OPC correction and reduce overhead and lead-times. With optics tuned for short proximity range only, the OPC processing can be done more easily, involving only intra-feature correction and closest-neighbor interactions. This can be done in the vector domain or after the pattern has been converted to a bitmap. The correction can be done in the bitmap in a fashion closely analog to what has been described for the SLM, and the bitmap can then be converted back to a vector format and fed to the mask writer.

The procedure described will improve the CD accuracy of any pattern, but it will not improve process latitude by assigning alternating phase areas or adding assist features. Such operations have to be done beforehand and provided in the input data.

Applications of this Technology

Does this technology promise to replace all other RETs (resolution enhancement techniques), one setup for everything? The answer is no because aggressive off-axis illumination and phase-shifting add contrast and thereby process latitude for specific features, e.g., gate lines. The disclosed technology has most benefit where general patterns need to be printed with equally good fidelity for all features, small and large, 1D and 2D. The typical application is masks: It may also be beneficial for ASICs where the cost of OPC processing adds to the mask cost and may become prohibitive. A third application is for direct-writing where OPC-free printing would allow faster turn-around times, thereby emphasizing the economic benefit of direct-writing.

In some places, the method disclosed has been described for mask writing, but it could equally well be used for other applications of SLM imaging, e.g., maskless lithography, and it could be used with other types of pattern generators and maskless systems. It is also possible to use the same method to process vector mask data: rasterize, correct for the mask writer and/or the scanner, and de-rasterize back to vector data.

We disclose a method to project an optical image onto a workpiece with extremely high resolution and fidelity, given the constraints of optical components. In view of the foregoing background, the method for printing highly accurate patterns is useful to improve the performance of such patterns and the time it takes for printing said patterns.

Accordingly, it is useful to improve the optics in order to lessen or even remove the need for optical proximity correction. The methods disclosed can be applied in a maskwriter, in a direct-writer or in mask-based lithography. The present application teaches a different method of printing features down to below 0.30*lambda/NA without OPC or with relatively little OPC. The gains are obvious: less cost, less complexity, simpler mask, shorter lead times and less overhead. The benefits are significant when printing from masks, and even larger when the object is an SLM.

In an example embodiment, we disclose a method for printing highly accurate patterns, e.g., in microlithography, including providing an image object, providing a workpiece, providing an illuminator illuminating the object and having an illuminator aperture function, further providing an optical projection system having in the projection pupil a pupil function and forming a partially coherent image on the workpiece, where said projection aperture function has a continuous or semi-continuous variation with the pupil coordinate.

In another example embodiment, we disclose an apparatus for printing highly accurate patterns, e.g., in microlithography, comprising an image object, a workpiece, an illuminator illuminating the object and having an illuminator aperture function, an optical projection system having in the projection pupil a pupil function and forming a partially coherent image on the workpiece, where said projection aperture function has a continuous or semi-continuous variation with the pupil coordinate.

In another example embodiment, we disclose a method for printing highly accurate patterns, e.g., in microlithography, including providing an image object, providing a workpiece, providing an illuminator illuminating the object and having an illuminator aperture function, further providing an optical projection system having in the projection pupil a pupil function and forming a partially coherent image on the workpiece, where the projection aperture function and the pupil function are chosen to provide good fidelity for a set of different feature types.

In another example embodiment, we disclose a method for design of an illuminator aperture and a matching pupil functions in a partially coherent projection system including providing a simulator for the partially coherent image, providing a description of the optical system, providing restrictions on the optical system, further performing an optimization of the image fidelity by modifying said two functions.

In another example embodiment, we disclose a method for printing a microlithographic pattern with reduced OPC correction above a specified interaction length including providing an illuminator aperture function, providing a pupil function, said functions being chosen to give essentially flat CD linearity for at least two and preferably a least three feature types above a linewidth essentially equal to said interaction length.

Yet another embodiment is a method of efficiently applying optical proximity correction using a spatial light modulator ("SLM") for printing highly accurate patterns on a workpiece in microlithography. This method may include correcting in a pixel domain a rasterized image of at least part of a feature, wherein the correction applies a four dimensional kernel with selected non-zero values to compensate for perturbations caused by optical proximity effects, whereby the number of additions and multiplications required to calculate the correction in the pixel domain, after selection of the non-zero values to include in the four dimensional kernel, are a substantially less than would be required for a full kernel. The method may further include forming a partially coherent image on the workpiece of the at least part of the feature. In general, by referring to substantially less or fewer additions and multiplications than would be required if using a full kernel, we mean approximately five percent or fewer of the additions and/or multiplications that would otherwise be required.

An aspect of this method is, optionally, performing the correcting concurrently with rasterizing or even in real time as pattern data is rasterized and fed to an SLM. This reduces the use of intermediate storage, as compared to a batch process, because the raster image is corrected and used without requiring persistence to non-volatile storage. Those of skill in the art will recognize that a rasterized image is likely to require much more storage than a vector image. By concurrently, we mean using a buffer to store part, but not all of the rasterized data for use in writing a pattern. By real time, we mean at a rate that allows the raster image to be corrected and used by the image generator without requiring persistence to non-volatile storage.

Another variation on the embodiment above is a method of efficiently applying optical proximity correction using a spatial light modulator ("SLM") for printing highly accurate patterns on a workpiece in microlithography. This method may include correcting in a pixel domain a rasterized image of at least part of a feature, wherein the correction applies a kernel having selected non-zero kernel elements to compensate for perturbations caused by optical proximity effects, wherein the correction applies a four dimensional kernel with selected non-zero values to compensate for perturbations caused by optical proximity effects, whereby the number of additions and multiplications required to calculate the correction in the pixel domain, after selection of the non-zero values to include in the four dimensional kernel, are a substantially less than would be required for a full kernel. The method may further include forming a partially coherent image on the workpiece of the at least part of the feature. This variation can be combined with the concurrent operation or real time aspect described in the preceding paragraph.

Yet another variation on the embodiments above is a method of efficiently applying optical proximity correction for printing highly accurate patterns on a workpiece in microlithography. This method may include rasterizing at least part of a feature including assigning pixel gray values and correcting edge perturbations caused by additional features within a range of interaction from the part of the feature by applying a correction kernel to the pixel gray values. It further may include printing a microlithographic pattern on the workpiece. This variation can be combined with the concurrent operation or real time aspect applicable to the preceding embodiments.

Any of these embodiments extend to producing features of a semi-conductor device. In one method, a feature is patterned, developed and produced on a mask, which is, in turn, used to pattern and produce a feature on a semiconductor substrate. Conventional methods that are well-know are used to follow this method. In another method, a feature is patterned, developed and produced by direct writing to a workpiece, such as a semiconductor substrate. Direct writing applications of SLM technology are described in several patent applications that name inventor Sandstrom and in several papers by Sandstrom in the field of microlithography. Direct writing has been well-described elsewhere and therefore need not be repeated here.

The method embodiments described herein can be practiced as devices. An SLM-based system or, more generally, a rasterizing microlithographic printer, with appropriate logic and resources to practice the methods disclosed will be a further embodiment of this technology. A subsystem of an SLM-base system or rasterizing microlithographic printer that controls the gray scaling of SLM elements is another embodiment. The subsystem may include some or all of gray-scaling control logic, a datapath, an optical path and/or an SLM controlled by the control logic, all of which can be combined with any or all of the subsystems of a maskwriter or direct writer.

The method embodiments also can be practiced as articles of manufacture, namely computer or machine readable media impressed with logic to carry out the method embodiments. The media may be rotating memory, such as magnetic or optical disks, or solid state memory, such as non-volatile updatable memory or masked memory, or volatile logic devices such as field programmable gate arrays (FPGAs) or dynamic memory of a signal processor or coupled to a processor.

We claim as follows:

1. A method of printing a microlithographic pattern with optical proximity correction allocated between vector and pixel domains, the method including:
   printing corrected rasterized data by microlithographic imaging onto a workpiece in multiple printing passes using offset pixel grids, after:
   rasterizing vector design data to produce rasterized data, wherein the vector design data includes some optical proximity correction features, but is missing a plurality of serifs, assist lines or non-printing features that would be applied in the absence of further optical proximity correction in the raster domain, and
   applying pixel domain optical proximity correction to produce the corrected rasterized data, by applying a pre-calculated, sparse perturbation correction matrix to at least grey pixels that represent positions of edges passing through particular pixels and changing the edge positions within the particular pixels.

2. The method of claim 1, wherein the perturbation correction matrix compensates for perturbation of a sample edge passing through a sample pixel caused by features with a short proximity range of the sample pixel, by applying correction coefficients to a sparse set of selected pixels within the short proximity range.

3. The method of claim 2, further including applying the further optical proximity correction in real time, as the corrected rasterized data is printing the corrected rasterized data onto the workpiece.

4. The method of claim 2, wherein the short proximity range is within about four pixels.

5. The method of claim 1, wherein applying the perturbation correction matrix further includes applying different degrees of correction, during the multiple printing passes using the offset pixel grids, when the edge positions are near centers of the grey pixels than when the same edges are offset and near sides of the grey pixels.

6. The method of claim 2, wherein applying the sparse perturbation correction matrix includes applying on the order of 39 coefficients.

7. The method of claim 1, wherein representation of a full interference matrix, integrating twice over each of two dimensions in the rasterized data, would involve on an order of 130,000 possible coefficients and the sparse perturbation correction matrix is populated by less than one percent of the possible coefficients.

8. The method of claim 1, further including preparing the perturbation correction matrix, including:
using a projected pixel size on the workpiece wherein, for a selected combination of illuminator design and numerical aperture, the projected pixel size produces a perturbation correction matrix with a reduced number of coefficients.

9. The method of claim 1, further including preparing the perturbation correction matrix, including:
analyzing a difference between printing of a first edge with only the first edge in the short proximity range and printing of the first edge placement when perturbed by additional design features in the short proximity range, where the additional design features include at least a second edge parallel to the first edge.

10. The method of claim 9, wherein the short proximity range is within about four pixels.

11. The method of claim 1, wherein the pre-calculated, sparse perturbation correction matrix is not applied centered on fully black or white pixels.

12. The method of claim 1, wherein the pre-calculated, sparse perturbation correction matrix is applied to grey pixels and fully black and white pixels.

* * * * *